United States Patent
Lee et al.

(10) Patent No.: US 9,570,783 B1
(45) Date of Patent: Feb. 14, 2017

(54) RADIO FREQUENCY MICRO-ELECTROMECHANICAL SYSTEMS HAVING INVERTED MICROSTRIP TRANSMISSION LINES AND METHOD OF MAKING THE SAME

(71) Applicant: General Electric Company, Schenectady, NY (US)

(72) Inventors: Yongjae Lee, Latham, NY (US); Joseph Alfred Iannotti, Glenville, NY (US); Christopher Fred Keimel, Schenectady, NY (US); Christopher James Kapusta, Delanson, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/839,402

(22) Filed: Aug. 28, 2015

(51) Int. Cl.
| | | |
|---|---|---|
| H01P 1/10 | (2006.01) |
| H01H 57/00 | (2006.01) |
| H01P 1/15 | (2006.01) |
| H01H 59/00 | (2006.01) |
| H01H 61/01 | (2006.01) |

(Continued)

(52) U.S. Cl.
CPC ............... *H01P 1/15* (2013.01); *H01H 55/00* (2013.01); *H01H 57/00* (2013.01); *H01H 59/0009* (2013.01); *H01H 61/01* (2013.01); *H01L 21/4853* (2013.01); *H01L 21/52* (2013.01); *H01L 21/54* (2013.01); *H01L 21/56* (2013.01);

(Continued)

(58) Field of Classification Search
CPC .............................. H01P 1/127; H01H 1/0036
USPC ......................... 333/101, 105, 262; 200/181
See application file for complete search history.

(56) References Cited

U.S. PATENT DOCUMENTS

| | | | |
|---|---|---|---|
| 6,184,463 B1 | 2/2001 | Panchou et al. | |
| 6,426,687 B1 * | 7/2002 | Osborn | H01P 1/127 |
| | | | 200/181 |

(Continued)

FOREIGN PATENT DOCUMENTS

| | | |
|---|---|---|
| JP | 2015028963 A | 2/2015 |
| WO | 2008018870 A1 | 2/2008 |

OTHER PUBLICATIONS

Irwin et al., "Quick Prototyping of Flip Chip Assembly With MEMS," Radio and Wireless Conference, Rawcon'98, Aug. 9-12, 1998, pp. 293-296.

(Continued)

*Primary Examiner* — Dean Takaoka
(74) *Attorney, Agent, or Firm* — Ziolkowski Patent Solutions Group, SC; Jean K. Testa

(57) ABSTRACT

A RF MEMS package includes a MEMS die assembly having a signal line formed on a top surface of a first mounting substrate, the signal line comprising a MEMS device selectively electrically coupling a first portion of the signal line to a second portion of the signal line, and two pairs of ground pads formed on the top surface of the first mounting substrate adjacent respective portions of the signal line. The pairs of ground pads are positioned adjacent respective sides of the MEMS device. A ground assembly is electrically coupled to the pairs of ground pads and includes a second mounting substrate and a ground region formed on a surface of the second mounting substrate. The ground region faces the top surface of the first mounting substrate and is electrically coupled to the pairs of ground pads. A cavity is formed between the ground region and the signal line.

22 Claims, 16 Drawing Sheets

(51) Int. Cl.
*H01H 55/00* (2006.01)
*H01L 21/48* (2006.01)
*H01L 21/56* (2006.01)
*H01L 21/52* (2006.01)
*H01L 21/54* (2006.01)
*H01H 61/00* (2006.01)

(52) U.S. Cl.
CPC .. *H01H 2057/006* (2013.01); *H01H 2061/006* (2013.01)

(56) References Cited

U.S. PATENT DOCUMENTS

| | | | |
|---|---|---|---|
| 6,621,387 B1 * | 9/2003 | Hopcroft | H01P 1/127 |
| | | | 200/181 |
| 6,627,999 B2 | 9/2003 | Akram et al. | |
| 6,713,695 B2 * | 3/2004 | Kawai | H01H 59/0009 |
| | | | 200/181 |
| 6,808,955 B2 * | 10/2004 | Ma | B81C 1/0023 |
| | | | 438/108 |
| 6,936,918 B2 * | 8/2005 | Harney | B81B 7/007 |
| | | | 257/704 |
| 7,045,440 B2 * | 5/2006 | Huff | B81B 7/0064 |
| | | | 257/703 |
| 7,808,092 B2 | 10/2010 | Ho | |
| 7,956,302 B1 | 6/2011 | Jean et al. | |
| 7,960,804 B1 * | 6/2011 | Ebel | B81C 1/00333 |
| | | | 200/181 |
| 8,115,283 B1 | 2/2012 | Bolognia et al. | |
| 8,441,328 B2 * | 5/2013 | Shin | H01H 59/0009 |
| | | | 333/105 |
| 8,587,106 B2 | 11/2013 | Bozler et al. | |
| 8,866,291 B2 | 10/2014 | Alm | |
| 8,988,169 B2 | 3/2015 | Hunt et al. | |
| 2004/0262645 A1 | 12/2004 | Huff et al. | |
| 2008/0122560 A1 | 5/2008 | Liu | |
| 2009/0029526 A1 | 1/2009 | Chang-Chien et al. | |
| 2009/0246929 A1 | 10/2009 | Margomenos et al. | |
| 2010/0019872 A1 | 1/2010 | Bozler et al. | |

OTHER PUBLICATIONS

Case, "SiGe MMICs and Flip-Chip MICs for Low-Cost Microwave Systems," 1997 IEEE Radio Frequency Integrated Circuits (RFIC) Symposium, Jun. 10, 1997, pp. 117-120.

Margomenos et al., "Wideband Micromachined Transitions for MEMS Tunable High-Q Filters," IEEE, Proceedings of the 36th European Microwave Conference, Sep. 1, 2006, Manchester, UK, pp. 1336-1339.

* cited by examiner

RADIO FREQUENCY MICRO-ELECTROMECHANICAL SYSTEMS HAVING INVERTED MICROSTRIP TRANSMISSION LINES AND METHOD OF MAKING THE SAME

BACKGROUND OF THE INVENTION

Embodiments of the invention relate generally to a radio frequency (RF) micro-electromechanical systems (MEMS) package, and more particularly to a RF MEMS package having an inverted or flipped ground plane design that forms a RF transmission line for a MEMS device that does not include its own integrated ground path.

RF MEMS devices are a technology that in its most general form can be defined as miniature devices that use an electrically actuated mechanical movement to achieve an open circuit or a closed circuit in a RF transmission line. When the RF MEMS device is in an on-position, the RF transmission line is "closed" and the RF MEMS device can be used to transmit a high-frequency RF signal.

One known technique for fabricating a RF transmission line is through the use of a microstrip transmission line 10, as shown in FIG. 1. Microstrip transmission line 10 includes a dielectric substrate 12 having a conductive signal line 14 positioned on a top surface 16 of the dielectric substrate 12 and a ground plane 18 positioned on a bottom surface 20 of the dielectric substrate 12. Conductive signal line 14 and ground plane 18 interact with each other to create an electromagnetic wave that travels through dielectric substrate 12 to create a RF signal. The width of the microstrip transmission line 10, the thickness of the dielectric substrate 12, and the relative dielectric constant of the material of the dielectric substrate 12 determine the characteristic impedance of the microstrip transmission line 10. A RF MEMS device may be included in the conductive signal line 14 so as to control whether the RF transmission line is "open" or "closed."

Microstrip transmission lines such as that illustrated in FIG. 1, are often used in conjunction with a conductive-backed coplanar waveguide transmission lines in high-frequency circuit designs. That is, the RF transmission line may transition from being in the form of a microstrip transmission line to being in the form of a conductive-baked coplanar waveguide transmission line.

FIG. 2 shows a conductive-backed coplanar waveguide transmission line 22 as known in the art. Coplanar waveguide transmission line 22 includes conductive signal line 14 positioned on the top surface 16 of the dielectric substrate 12. When transitioning between a microstrip transmission line 10 to a coplanar waveguide transmission line 22 on the same dielectric substrate 12, signal line 14 continues across the top surface 16 of the dielectric substrate 12 through the transition. Coplanar waveguide transmission line 22 further includes and a pair of ground lines 28, 30 positioned on the top surface 16 of the dielectric substrate 12 and on either side of the conductive signal line 14. As such, the signal line 14 and ground lines 28, 30 are positioned on the same side, and, therefore, are coplanar. In addition, ground plane 18 is positioned on the bottom surface 20 of the dielectric substrate 12, and similar to signal line 14 continues across the bottom surface 20 of dielectric substrate 12 through the transition. Coplanar waveguide transmission line 22 further includes a plurality of grounding vias 36 formed through the thickness of the dielectric substrate 12 so as to electrically connect ground lines 28, 30 and ground plane 18. A RF signal is created by an electromagnetic wave between signal line 14 and ground plane 18 and also between ground lines 28, 30 and signal line 14.

As discussed above, RF transmission lines used in a high-frequency circuit design include a ground plane that is integrated onto the bottom surface of the mounting substrate of the MEMS device. The integrated ground plane interacts with the signal line and creates an electromagnetic wave and RF signal. However, because not all MEMS packages are manufactured with an integrated ground plane, existing MEMS packages must be modified prior to being integrated into devices for RF transmission. Such a modification includes positioning a ground plane on the surface of the mounting substrate opposite the MEMS device and forming vias through the substrate to electrically connect the ground plane to the ground lines on the top surface of the substrate. However, the creation of vias in substrates made from materials such as quartz and silicon can be difficult and time consuming.

Therefore, it would be desirable to integrate a MEMS device that does not include an integrated ground plane into a RF MEMS package without structural modifications to the MEMS device or its associated mounting substrate.

BRIEF DESCRIPTION OF THE INVENTION

In accordance with one aspect of the invention, a radio frequency (RF) microelectromechanical system (MEMS) package includes a MEMS die assembly having a first mounting substrate, a signal line formed on a top surface of the first mounting substrate, the signal line comprising a MEMS device selectively electrically coupling a first portion of the signal line to a second portion of the signal line, a first pair of ground pads formed on the top surface of the first mounting substrate adjacent the first portion of the signal line, and a second pair of ground pads formed on the top surface of the first mounting substrate adjacent the second portion of the signal line. The RF MEMS package also includes a ground assembly electrically coupled to the first pair of ground pads and the second pair of ground pads, the ground assembly having a second mounting substrate, and a ground region formed on a surface of the second mounting substrate facing the top surface of the first mounting substrate and electrically coupled to the first pair of ground pads and the second pair of ground pads. A cavity is formed between the ground region and the signal line, and the first pair of ground pads is positioned adjacent a first side of the MEMS device and the second pair of ground pads is positioned adjacent a second side of the MEMS device.

In accordance with another aspect of the invention, a method of manufacturing a radio frequency (RF) microelectromechanical system (MEMS) package includes providing a first mounting substrate, and forming a signal line on a top surface of the first mounting substrate, wherein forming the signal line includes forming a first portion of the signal line on the top surface of the first mounting substrate, forming a second portion of the signal line on the top surface of the first mounting substrate so as to provide a gap between the first portion and the second portion, and coupling a MEMS device to the first portion of the signal line and the second portion of the signal line to bridge the gap. The method further includes forming a first pair of ground pads on the top surface of the first mounting substrate adjacent the first portion of the signal line, forming a second pair of ground pads on the top surface of the first mounting substrate adjacent the second portion of the signal line, the second pair of ground pads spaced apart from the first pair of ground pads, coupling a ground assembly to the first pair of ground pads and the second pair of ground pads, the ground assembly comprising a ground region formed on a bottom surface of a second mounting substrate, and spacing the ground region apart from the signal line so as to provide a cavity therebetween.

In accordance with yet another aspect of the invention, a radio frequency (RF) microelectromechanical system (MEMS) wafer structure includes a MEMS wafer assembly having a plurality of MEMS devices disposed on a top surface of a wafer substrate, a plurality of signal lines formed on the top surface of the wafer substrate, each signal line having a first portion positioned on a first side of a respective MEMS device and a second portion positioned on a second side of the respective MEMS device, the second portion separated from the first portion by a first gap, a first pair of ground pads adjacent to and on either side of the first portion of a respective signal line, and a second pair of ground pads adjacent to and on either side of the second portion of the respective signal line. The RF MEMS wafer structure further includes a ground plane assembly comprising a ground plane formed on a bottom surface of a ground substrate, the ground plane bonded to the first pair of ground pads and second pair of ground pads, wherein the ground plane and the plurality of signal pads are spaced apart by a plurality of cavities, each cavity containing a respective MEMS device, and the top surface of the MEMS substrate adjacent the plurality of MEMS devices is free of ground pads.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 6 is a schematic sectional view of the RF MEMS package of FIG. 4 taken along lines 6-6 and 6a-6a.

DETAILED DESCRIPTION

Embodiments of the invention provide for a radio frequency (RF) micro-electromechanical systems (MEMS) package that includes an inverted or flipped ground plane design that forms a RF transmission line for a MEMS device that does not include its own integrated ground path. The RF transmission line is formed by coupling a secondary substrate that includes a ground plane to a MEMS device. The interaction between the ground plane formed on the secondary substrate and the signal line of the MEMS device on the primary substrate creates a RF transmission line. As a result, the RF transmission line is created without altering or modifying the physical structure of the MEMS device or its mounting substrate.

Figure 3:
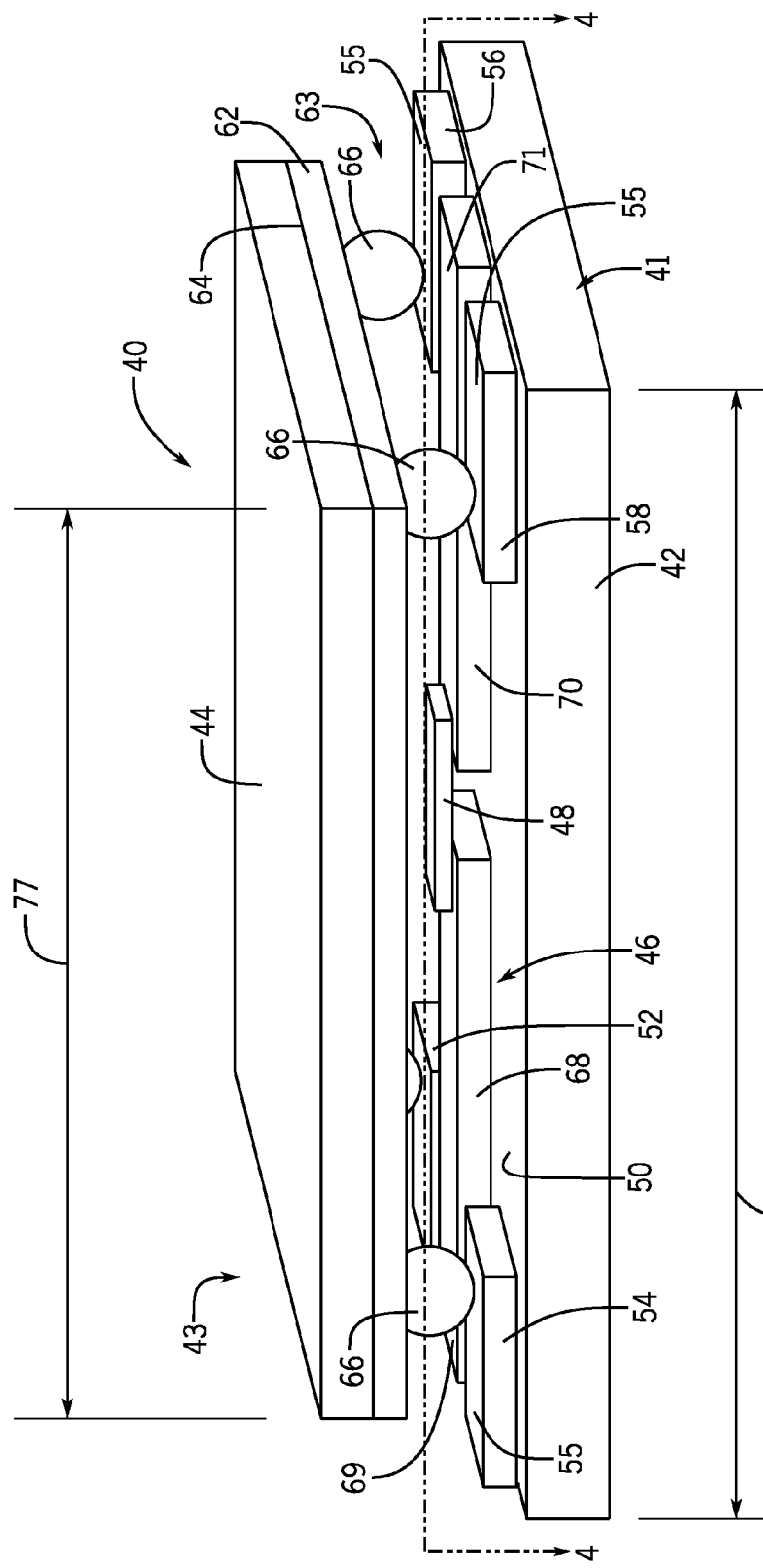
FIG. 3 is a schematic perspective view of a RF MEMS package, according to an embodiment of the invention.

Referring first to FIG. 3, a schematic perspective view of a RF MEMS package 40 in accordance with an embodiment of the invention is illustrated. RF MEMS package 40 includes a MEMS die assembly 41 and a ground plane assembly 43. MEMS die assembly 41 includes a MEMS mounting substrate 42, which has an electrically conducting signal line 46, including a MEMS device 48, disposed on a top surface 50 thereof. MEMS substrate 42 is a bulk carrier substrate formed of an insulating, semi-insulating material, or semi-conductive material such as, but not limited to, quartz, alumina, gallium arsenide, silicon, and the like. In one embodiment of the invention, MEMS device 48 is an ohmic contact switch mechanism. However, in alternative embodiments, MEMS device 48 may be a capacitive contact switch mechanism. In addition, MEMS device 48 may utilize any actuation mechanism known in the art such as, but not limited to, magnetic, piezoelectric, thermal, and electrostatic forces.

Figure 1:
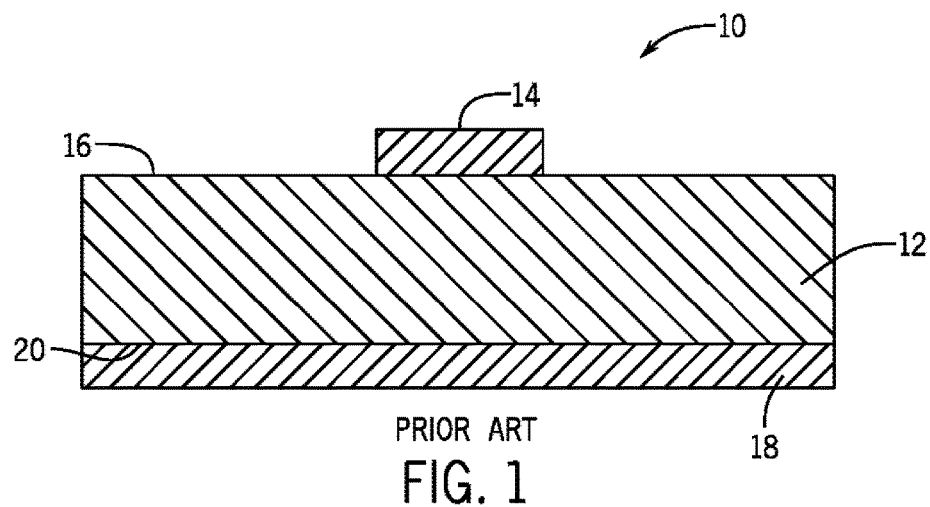
FIG. 1 is a microstrip transmission line as known in the prior art.
Figure 2:
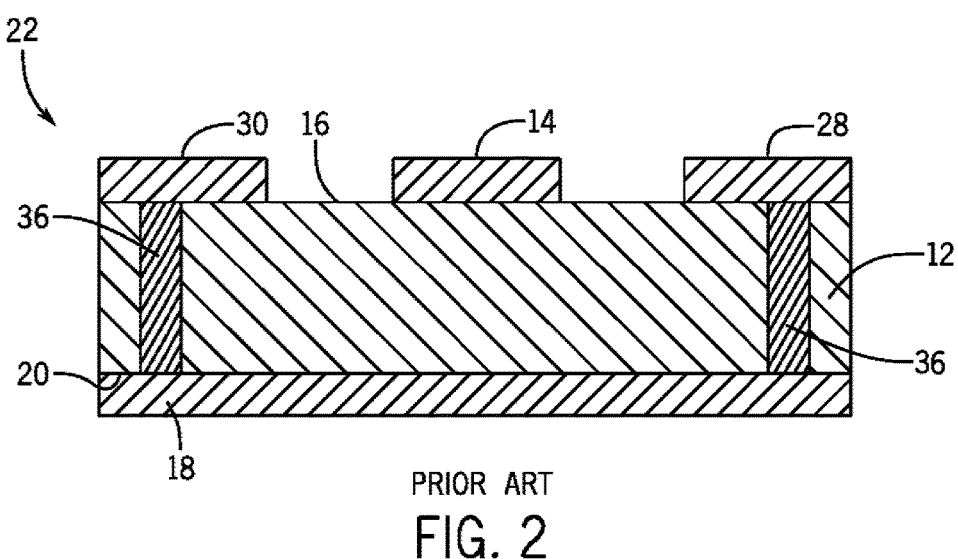
FIG. 2 is a conductive-backed coplanar waveguide transmission line as known in the prior art.

A first pair of electrically conducting ground lines or pads 52, 54 and a second pair of electrically conducting ground lines or pads 56, 58 are disposed on the top surface 50 of first substrate 42. Unlike the prior art devices of FIGS. 1 and 2, MEMS die assembly 41 of FIG. 3 does not include a ground plane formed on a bottom surface 60 thereof. As a result, RF signals do not propagate freely through MEMS die assembly 41 when MEMS die assembly 41 is used as a standalone device.

Ground plane assembly 43 is coupled to MEMS die assembly 41 to improve the propagation of RF signals through MEMS die assembly 41. Ground plane assembly 43 includes a ground plane/region 62 that is formed on a bottom surface 64 of a ground mounting substrate 44. Similar to MEMS substrate 42, ground substrate 44 is an insulating or semi-insulating material, such as, but not limited to, quartz, alumina, gallium arsenide, and silicon, and the like. Ground plane 62 is bonded and electrically coupled to ground pads 52-58 through electrical contacts or interconnects 66, such as, for example, gold stud bumps. Ground plane 62 may be any conductive material such as, for example, copper, gold, a tungsten/nickel/gold stack, or another common packaging material. It is contemplated that stud bumps 66 may be any material suitable for bonding and electrically coupling ground pads 52-58 to ground plane 62, for example, but not limited to solder bumps, gold bumps, and thermosonic attachment bumps. Together, signal line 46 and ground plane 62 form a RF transmission line 63. The electrical impedance of the RF transmission line 63 may be manipulated by adjusting the distance between signal line 46 and ground plane 62, which is controlled by the height of stud bumps 66.

Based on the arrangement of the ground plane 62 and MEMS substrate 42, the resulting structure of RF MEMS package 40 has a flipped or inverted orientation as compared to prior art structures, with the ground plane 62 positioned above, rather than below, the signal line 46 and ground pads 52, 58. Such an arrangement permits RF signal propagation in the absence of through vias formed through the dielectric substrate 42 of the MEMS die assembly 41. The illustrated package construction is especially advantageous where the substrate 42 is a difficult material to process, such as quartz or silicon, and also permits packages to be constructed with higher density signal lines, as described in more detail below.

Figure 4:
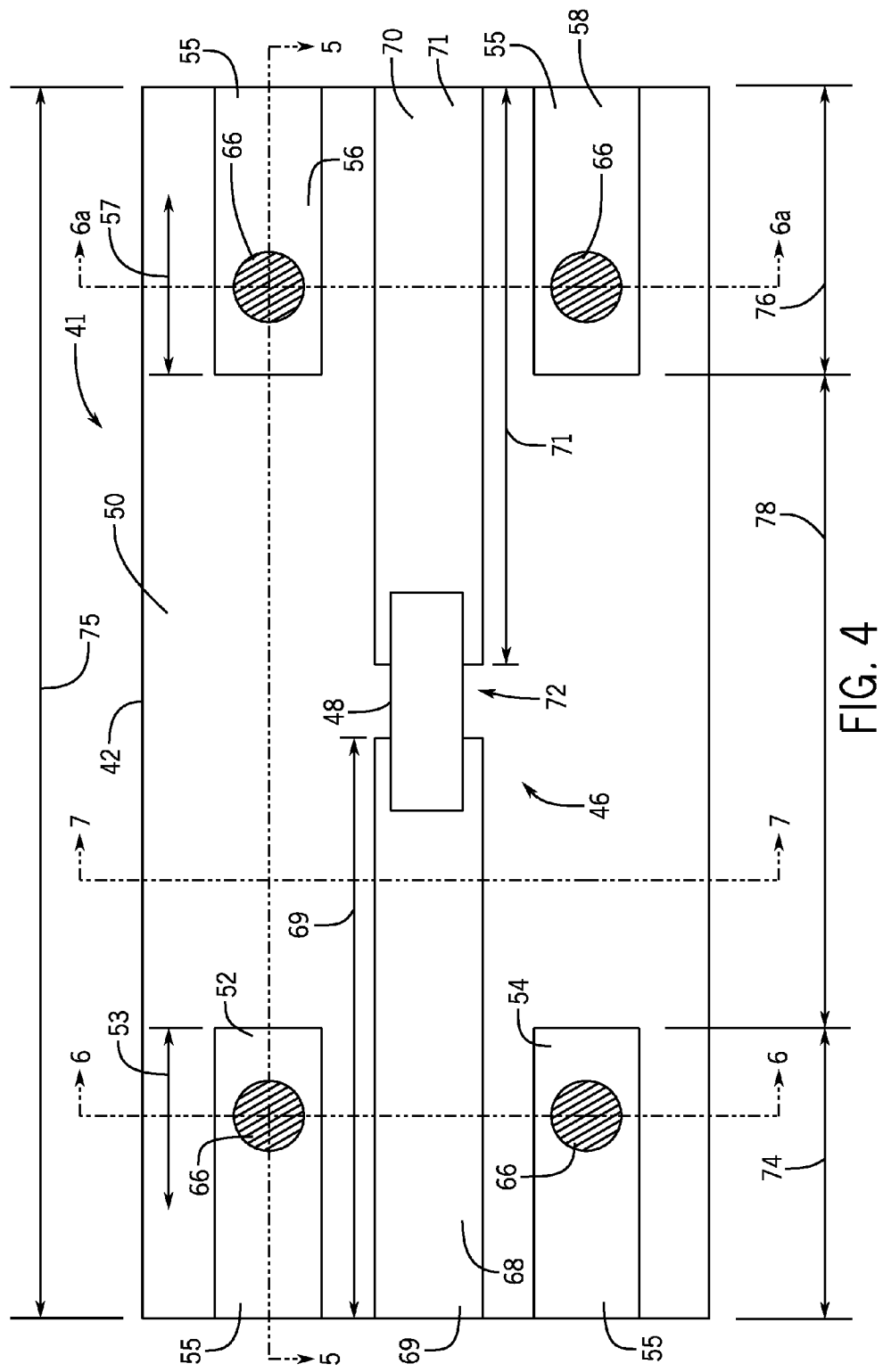
FIG. 4 is a schematic cross-sectional view of the RF MEMS package of FIG. 3 taken along line 4-4.
Figure 5:
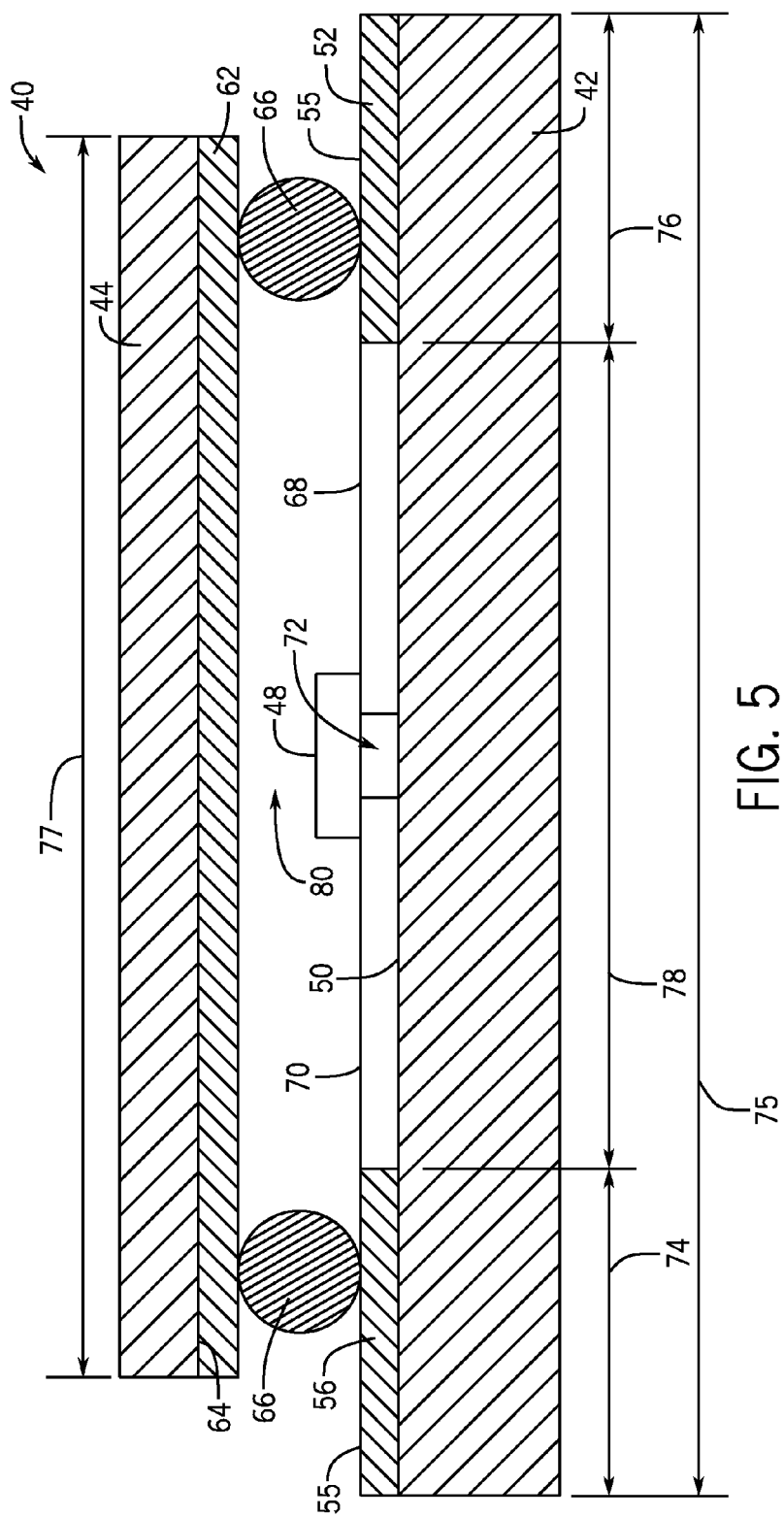
FIG. 5 is a schematic cross-sectional view of the RF MEMS package of FIG. 4 taken along line 5-5.

FIG. 4 is a schematic cross-sectional view of RF MEMS package 40, depicting a top view of MEMS die assembly 41. FIG. 5 is a schematic cross-sectional view of RF MEMS package 40 through line 5-5 of FIG. 4. Referring to FIGS. 4 and 5 together where appropriate, signal line 46 includes a first portion 68, a second portion 70, and a MEMS device 48. First portion 68 of signal line 46 and second portion 70 of signal line 46 are separated by a gap 72, which is bridged by MEMS device 48. When MEMS device 48 is in an "ON" state or closed position (shown in FIG. 5), MEMS device 48 electrically couples first portion 68 of signal line 46 to second portion 70 of signal line 46, which creates a closed circuit on the RF transmission line 63. When MEMS device 48 is in an "OFF" state or open position, first and second portions 68, 70 of signal line 46 are electrically disconnected, creating an open circuit on the RF transmission line 63.

As shown, the first pair of ground pads 52, 54 are disposed on the top surface 50 of first substrate 42 adjacent the first portion 68 of signal line 46 and do not extend across the entirety of first substrate 42. That is, the first pair of ground pads 52, 54 are limited to a first portion 74 of the overall length 75 of top surface 50 of first substrate 42. Similarly, the second pair of ground pads 58, 56 are disposed on the top surface 50 of first substrate 42 adjacent the second portion 70 of signal line 46, and limited to a second portion 76 of the overall length 75 of the top surface 50 of first substrate 42. A length 53 of each of the first pair of ground pads 52, 54 is less than a length 69 of first portion 68. Likewise, a length 57 of each of the second pair of ground pads 56, 58 is less than a length 71 of second portion 70. As a result, a third or remaining portion 78 of the overall length 75 of top surface 50 adjacent MEMS device 48 has no ground pads positioned thereon. In other words, the first pair of ground pads 52, 54 is spaced apart from the second pair of ground pads 58, 56 across the length 75 of first substrate 42.

Stud bumps 66 define the height of a cavity 80 created between signal line 46 and ground plane 62. Cavity 80 is filled with a dielectric medium such as, for example, but not limited to air or a dielectric gas such as nitrogen, according to alternative embodiments of the invention in order to dampen resonant responses within the package 40. In one embodiment of the invention, cavity 80 is vacuum or hermetically sealed between ground plane 62 and MEMS substrate 42. It is contemplated that any hermetic sealing process known in the art may be used, for example, but not limited to, hermetic solder sealing, glass frit sealing, and gold-gold thermo-compression sealing. As a result of the hermetic seal, cavity 80 does not fluidically communicate with the external environment.

As shown in FIGS. 3 and 5, in one embodiment of the invention the overall length 75 of MEMS die assembly 41 may be greater than an overall length 77 of ground plane assembly 43. As a result, ground pads 52-58 each include a ground contact surface 55 that extends beyond the ground plane 62. Likewise, the first portion 68 of signal line 46 includes a first signal contact surface 69 that extends beyond the ground plane 62 and the second portion 70 of signal line 46 includes a second signal contact surface 71 that extends beyond the ground plane 62. According to alternative embodiments, ground contact surfaces 55, first signal contact surface 69, and second signal contact surface 71 may include wirebonds (not shown) connected to an external circuit (not shown) or be coupled to a ground-signal-ground (GSG) probe (not shown) in order to test the RF MEMS package 40 by measuring or injecting a ground signal.

Figure 6:
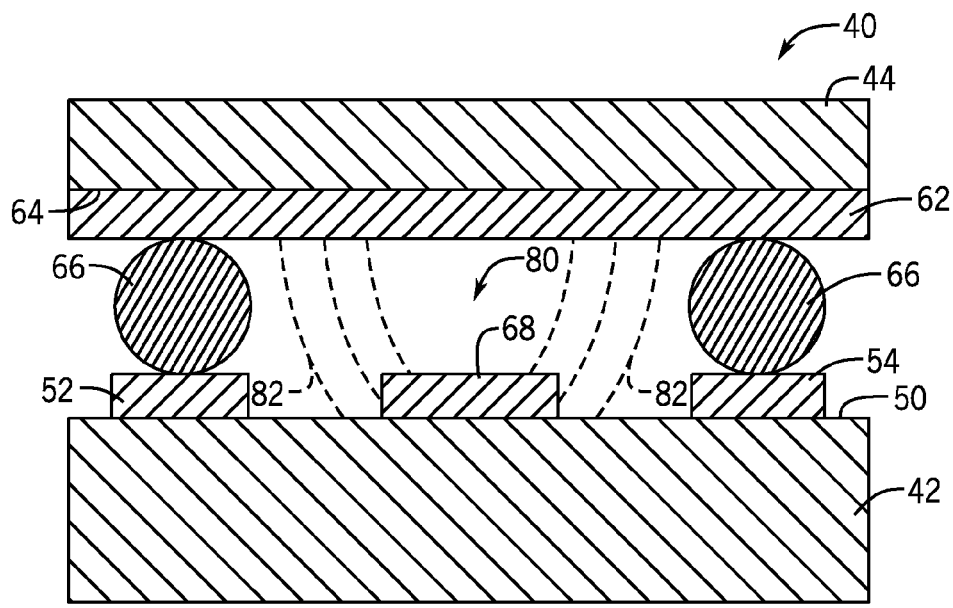

FIG. 6 is a sectional view of RF MEMS package 40 that illustrates the lateral components of the electric field along lines 6-6 and 6a-6a of FIG. 4, within the first portion 74 and the second portion 76 of RF MEMS package 40, respectively. As shown in FIG. 6, a ground substrate 44 extends above MEMS substrate 42, and a ground plane 62 is coupled to the bottom surface 64 of ground substrate 44. In addition, ground plane 62 is electrically bonded to ground pads 52, 54 via stud bumps 66. The electromagnetic field generated between signal line 46 and ground plane 62 includes a lateral component 82 that extends through cavity 80.

Figure 7:
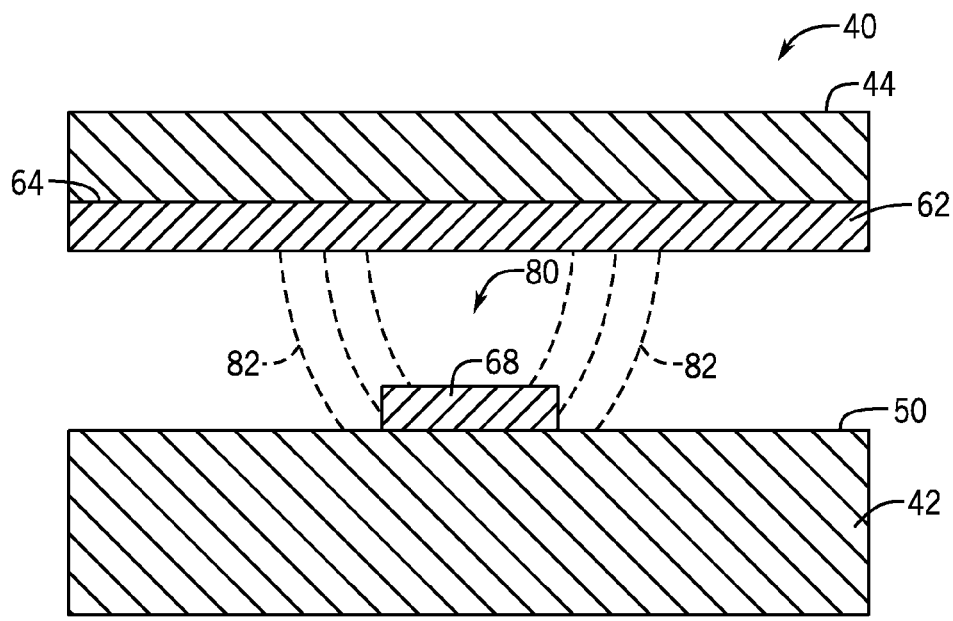
FIG. 7 is a schematic sectional view of the RF MEMS package of FIG. 4 taken along line 7-7.

The schematic sectional view of RF MEMS package 40 shown in FIG. 7 depicts the lateral components of the electric field along line 7-7 of FIG. 4, within the third portion 78 of RF MEMS package 40. Similar to the electromagnetic field within portions 74, 76, the electromagnetic field within this portion 78 of RF MEMS package 40 is generated between the first portion 68 of signal line 46 and ground plane 62. As a result, the lateral component 82 of the electromagnetic field extends only through cavity 80, not through MEMS substrate 42. Because the electromagnetic field travels through the cavity 80 and does not permeate the MEMS substrate 42 within the third portion 78 of the package 40, signal losses within the RF MEMS package 40 are significantly improved as compared to prior art devices wherein the electromagnetic field permeates the dielectric substrate throughout the entirety of the package structure. Further, the material selection for the MEMS substrate 42 can be made without having to take into account potential signal losses, thereby permitting a wider range of materials to be used for package manufacture.

While FIGS. 3-7 depict ground plane 62 as being uniformly applied to the bottom surface 64 of ground substrate 44, it is contemplated that in alternative embodiments of the invention ground plane 62 may vary in thickness. In such embodiments, ground plane 62 may include any combination of protrusions extending from ground plane 62 and cutouts formed in ground plane 62. The geometry of these protrusions and/or cutouts may be selected based on design specifications to achieve a desired electrical resonance of the RF transmission line 63. In addition, the electrical resonance of the RF transmission line 63 may be tuned by varying the height, length, and/or width of cavity 80.

Figure 8:
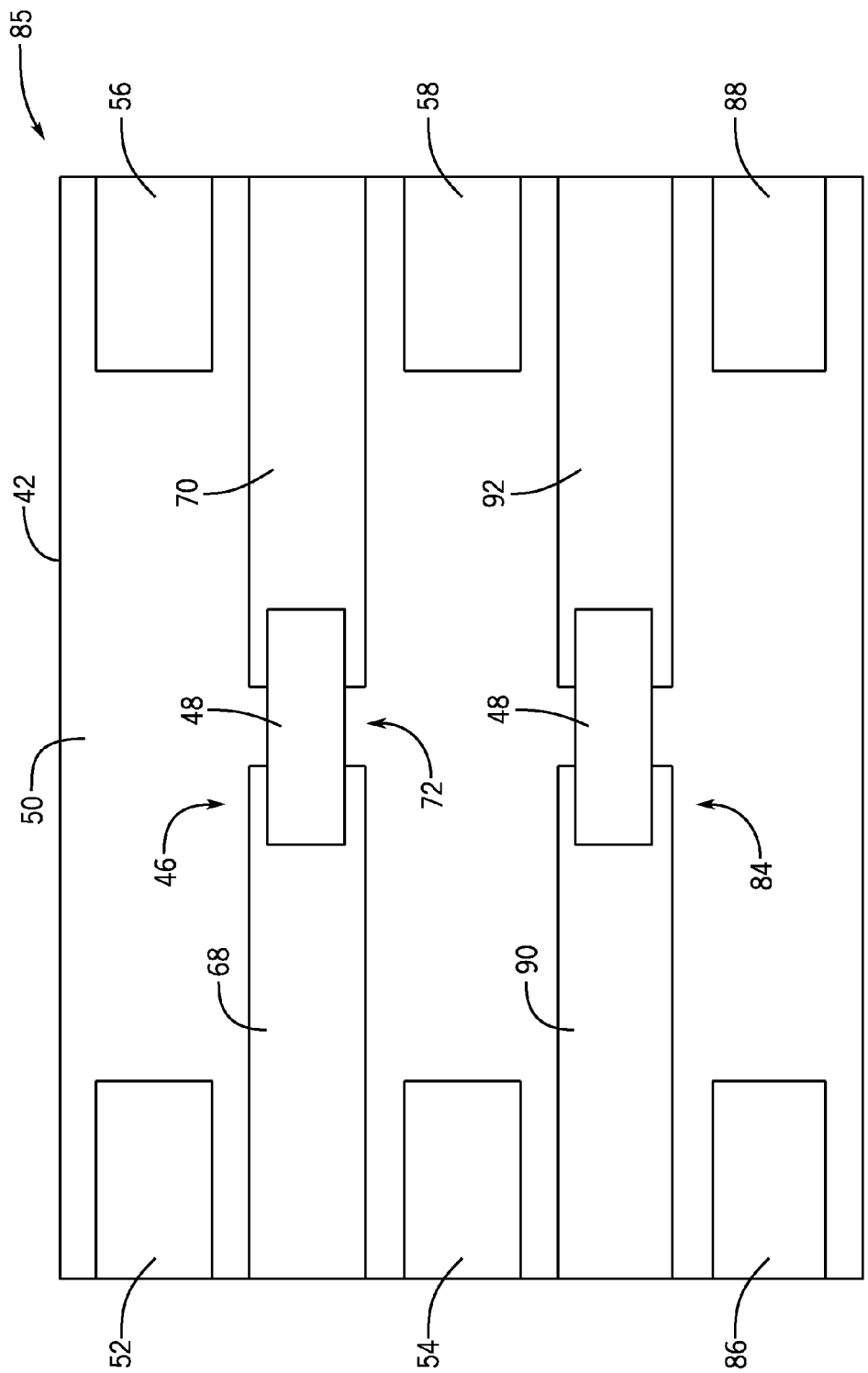
FIG. 8 is a schematic top view of a first substrate of a RF MEMS package, according to another embodiment of the invention.

Referring now to FIG. 8, a MEMS die assembly 85 is shown that includes multiple signal lines 46, 84 according to an alternative embodiment of the invention. MEMS die assembly 85 includes components similar to components of MEMS die assembly 41 of FIG. 3, and thus numbers used to indicate components in FIG. 3 will also be used to indicate similar components in FIG. 8. MEMS die assembly 85 may be used in place of MEMS die assembly 41 in RF MEMS package 40 (FIG. 3) in applications where increased signal density is desired.

As depicted in FIG. 8, a first signal line 46 and a second signal line 84 are formed on the top surface 50 of MEMS substrate 42. Signal lines 46, 84 are constructed similarly to signal line 46 (FIG. 3) and include a respective MEMS device 48. A first group of ground lines or pads 52, 54, 86 and a second group of ground lines or pads 56, 58, 88 are formed on the top surface 50 of first substrate 42. As shown, to the first portion 68 of signal line 46 is positioned between ground pads 52, 54 and a first portion 90 of signal line 84 is positioned between ground pads 54, 86. Similarly ground pads 56, 58 are adjacent opposing sides of the second portion 70 of signal line 46, and ground pads 58, 88 are adjacent opposing sides of a second portion 92 of signal line 84. Ground pads 52-58, 86, 88 may be electrically connected to ground plane assembly 43 (FIG. 3) via electrical contacts or stud bumps 66 (FIG. 3) in a similar manner as described with respect to FIGS. 3-7.

While the embodiment illustrated in FIG. 8 includes a single ground pad 54 between adjacent first portions 68, 90 of signal lines 46, 84 and a single ground pad 58 between adjacent second portions 70, 92 of signal lines 46, 84 in order to save space on the top surface of the MEMS substrate 42 and allow for a smaller and more compact MEMS package, it is contemplated that each signal line 46, 84 may include its own first and second pairs of ground pads.

Although FIG. 8 illustrates the use of two (2) signal lines, a first group of three (3) ground pads, and a second group of three (3) ground pads, it is contemplated that any number n of signal lines may be formed on the top surface of the first substrate, along with a first and second group of ground pads containing any number n+1 (or n·2) of ground pads.

Figure 9:
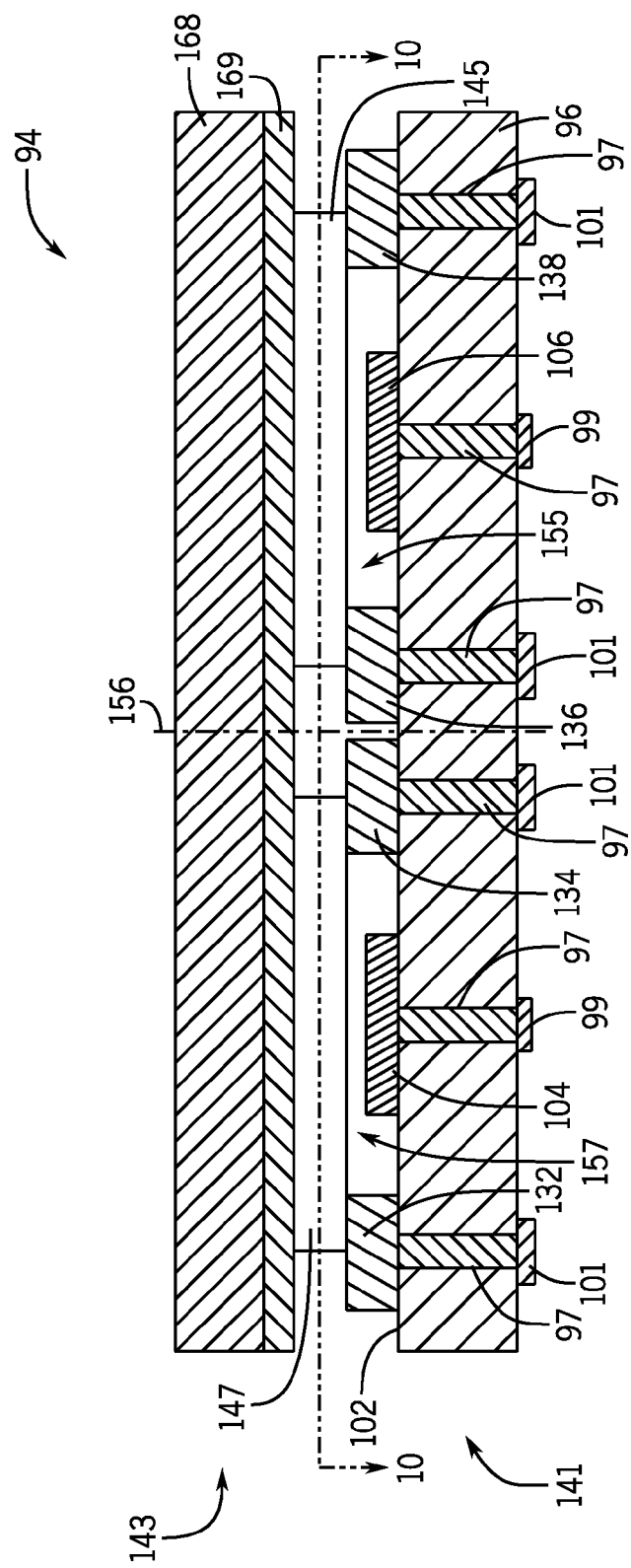
FIG. 9 is a schematic side view of a RF MEMS wafer structure, according to another embodiment of the invention.

In one embodiment of the invention, RF MEMS package 40 (FIG. 3) is singulated from a RF MEMS wafer structure 94 such as that illustrated in FIG. 9. RF MEMS wafer structure 94 includes a ground plane assembly 143 coupled to a MEMS wafer assembly 141 by way of conductive joints 145, 147 and/or a combination of electrical interconnects or stud bumps 166 and hermetic seals 149, 151. Similar to ground plane assembly 43 of FIG. 3, ground plane assembly 143 includes a ground plane or ground region 169 bonded to a ground substrate 168. A cross-sectional view of RF MEMS wafer structure 94 taken along line 10-10 is provided in FIG. 10 to illustrate the details of MEMS wafer assembly 141 and conductive joint 145.

Figure 10:
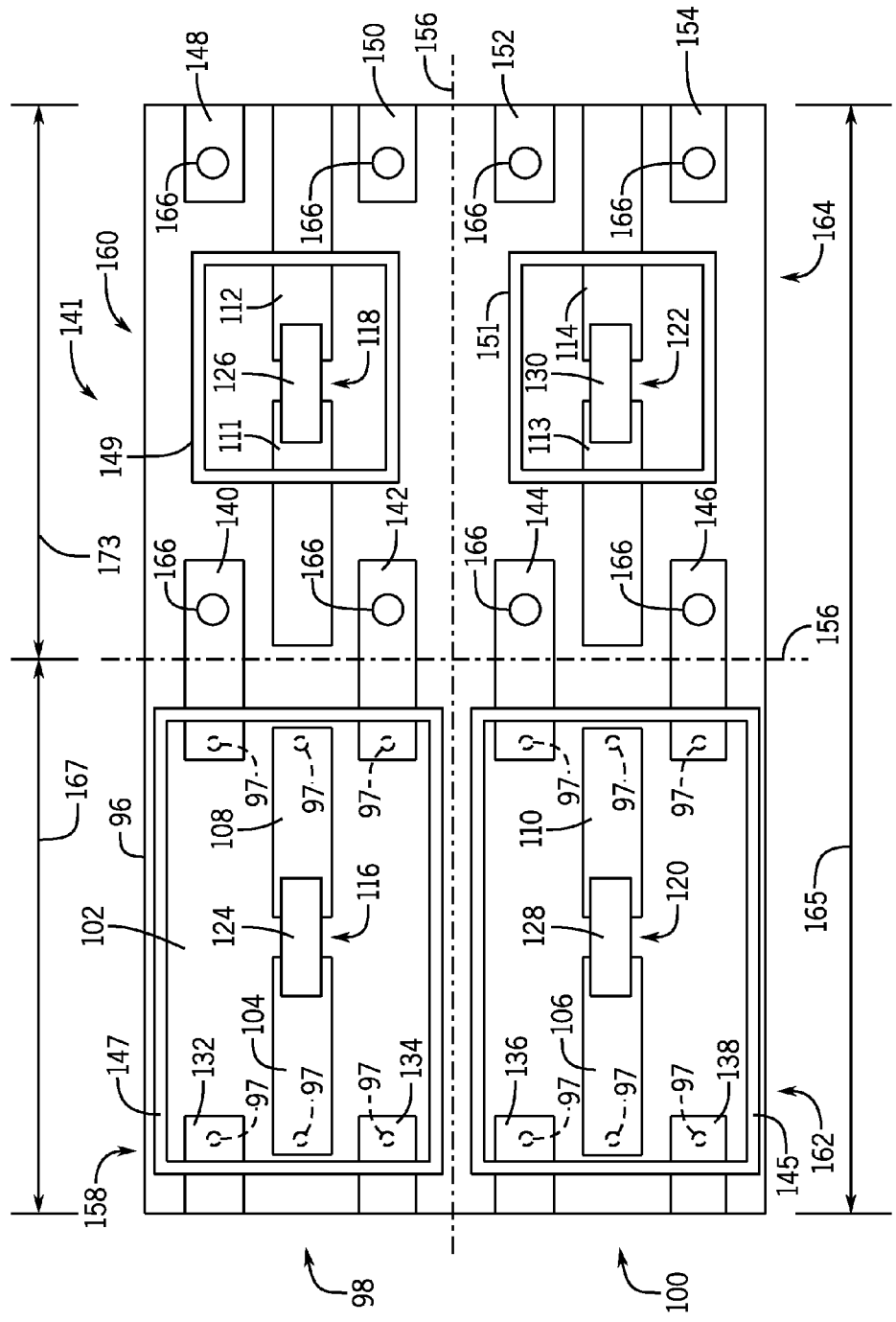
FIG. 10 is a schematic cross-sectional view of the RF MEMS wafer structure of FIG. 9 taken along line 10-10.

Referring now to FIGS. 9 and 10 together where appropriate, MEMS wafer assembly 141 includes MEMS devices 124, 126, 128, 130 provided on respective signal lines 98, 100, which are formed on a top surface 102 of MEMS wafer substrate 96. As shown in FIG. 10, each signal line 98, 100 is patterned in a plurality of signal line portions, with signal lines 98, 100 including respective first portions 104, 106, second portions 108, 110, third portions 111, 113, and fourth portions 112, 114. A first gap 116 separates first portion 104 from second portion 108, and a second gap 118 separates third portion 111 from fourth portion 112. MEMS device 124 bridges the first gap 116 and electrically couples first portion 104 and second portion 108, MEMS device 126 bridges the second gap 118 and electrically couples third portion 111 to fourth portion 112. Likewise, MEMS device 128 is positioned to bridge the first gap 120 on signal line 100 and second MEMS device 130 is positioned to bridge the second gap 122 of signal line 100.

Similar to MEMS device 48, MEMS devices 124, 126, 128, 130 selectively couple their respective signal line portions. For example: MEMS device 124 electrically couples portions 104, 108 when in a closed position and electrically decouples portions 104, 108 when in an open position, and MEMS device 126 electrically couples portions 108, 112 when in a closed position and electrically decouples portions 108, 112 when in an open position. Likewise, MEMS device 128 electrically couples portions 106, 110 when in a closed position and electrically decouples portions 106, 110 when in an open position, and MEMS device 130 electrically couples portions 110, 114 when in a closed position and electrically decouples portions 110, 114 when in an open position.

MEMS wafer assembly 141 also includes groups of ground lines or ground pads positioned between the adjacent signal lines 98, 100. Specifically, a first group of ground pads 132, 134, 136, 138 are formed on the top surface 102 of MEMS wafer substrate 96, with ground pads 132, 134 adjacent to and on opposing sides of the first portion 104 of signal line 98 and ground pads 136, 138 adjacent to and on opposing sides of the first portion 106 of signal line 100. Similarly, a second group of ground pads 140, 142, 144, 146 are positioned adjacent to and on opposing sides of the second portions 108, 110 and third portions 111, 113 of signal lines 98, 100. A third group of ground pads 148, 150, 152, 154 are positioned adjacent to and on opposing sides of respective fourth portions 112, 114 of signal lines 98, 100. As shown in FIG. 10, the first group of ground pads 132-138, the second group of ground pads 140-146, and the third group of ground pads 148-154 are electrically disconnected from each other across a width 165 of the wafer substrate 96.

While FIG. 10 depicts each signal line 98, 100 having two (2) gaps, two (2) MEMS devices, and four (4) signal line portions, it is contemplated that each signal line of wafer structure 94 may include any number n of gaps, n MEMS devices and n*2 signal line portions. For example, signal line 98 may include four (4) gaps, four (4) MEMS devices, and eight (8) signal line portions. Further, it is contemplated that more or less than two (2) signal lines may be formed on the top surface 102 of MEMS wafer substrate 96. Further, although FIG. 10 depicts the use of three (3) groups of ground pads corresponding to the four (4) portions of each signal line, it is contemplated that any number of n groups of ground pads may be used. In addition, alternative embodiments may include any number n of ground pads within each group of ground pads corresponding to any number n/2 of signal lines.

In one embodiment of the invention, conductive joints 145, 147 are formed of an electrically conductive material that electrically and mechanically bonds the ground plane 169 of the ground plane assembly 143 to the MEMS wafer assembly 141. For example, grounds pads 132-146, conductive joints 145, 147, and ground plane 169 may each be formed of gold and, as a result, conductive joints 145, 147 bond respective grounds pads 132-146 to ground plane 169 by way of a gold-gold thermo-compression bond. As shown in FIG. 9, conductive joints 145, 147 create respective cavities 155, 157 hermetically sealed between the ground plane 169 and signal lines 98, 100. Each cavity 155, 157 may be filled with air or other dielectric gas, such as, but not limited to, nitrogen. Alternatively, the ground pads and ground plane 169 may be electrically coupled together using stud bumps 166, similar to the procedure described with respect to FIGS. 3-7, and individual hermetic seals 149, 151 are formed surrounding respective MEMS devices 126, 130 using non-conductive materials, such as, for example, glass-frit, as shown in the right side portion of FIG. 10.

In embodiments of the invention that include conductive joints 147, 145, the first and second portions 104, 106, 108, 110 of signal lines 98, 100 are disposed entirely within respective cavities 157, 155, as shown in FIG. 9 and the left side portion of FIG. 10. Electrically conductive vias 97 are formed through the wafer substrate 96. A portion of the vias 97 electrically connects first and second portions 104, 106, 108, 110 of signal lines 98, 100 to a corresponding signal line probe pad 99. Another portion of the vias 97 electrically connects ground pads 132-146 to a corresponding ground line probe pad 101. In turn, a GSG probe (not shown) may be used to measure or inject a ground signal for testing the RF MEMS package 158, 162. Probe pads 99, 101 are sized in relation to the signal lines 98, 100, ground pads 132-146, and ground plane 169 such that they have a negligible impact the RF signal propagation of the RF transmission line.

While a combination of conductive joints 145, 147 and stud bumps 166/individual hermetic seals 149, 151 are shown in FIG. 10 for illustrative purposes, it is contemplated that a given wafer package would be constructed having either all conductive joints, or all hermetic seal/stud bump combinations to simplify the fabrication procedure.

After the ground plane assembly 143 is coupled to the MEMS wafer assembly 141, the resulting RF MEMS wafer structure 94 may be singulated into individual RF MEMS packages 158, 160, 162, 164 along cut lines 156.

In embodiments where the signal lines are entirely sealed within a cavity, such as RF MEMS packages 158, 162, the overall width 167 of the singulated package is substantially equal to the width of the corresponding ground assembly. Vias 97 are provided to create interfaces to the ground planes and signal lines. Alternately, in RF MEMS packages such as packages 162 and 164 where the ground pads and signal lines extend beyond respective hermetic seals 149, 151, the overall width 173 of the singulated package is greater than that of the corresponding ground assembly similar to the arrangement shown in FIG. 3. In these embodiments, electrical connectivity to the ground planes and signal lines may be made through wirebond connections or a GSG probe as described above.

As illustrated in FIG. 10, each RF MEMS die package 158-164 includes a signal line flanked by respective ground pads. In alternative embodiments of the invention, each RF MEMS package 158-164 may include more than one (1) signal line, similar to MEMS die assembly 85 shown in FIG. 8.

Figure 11:
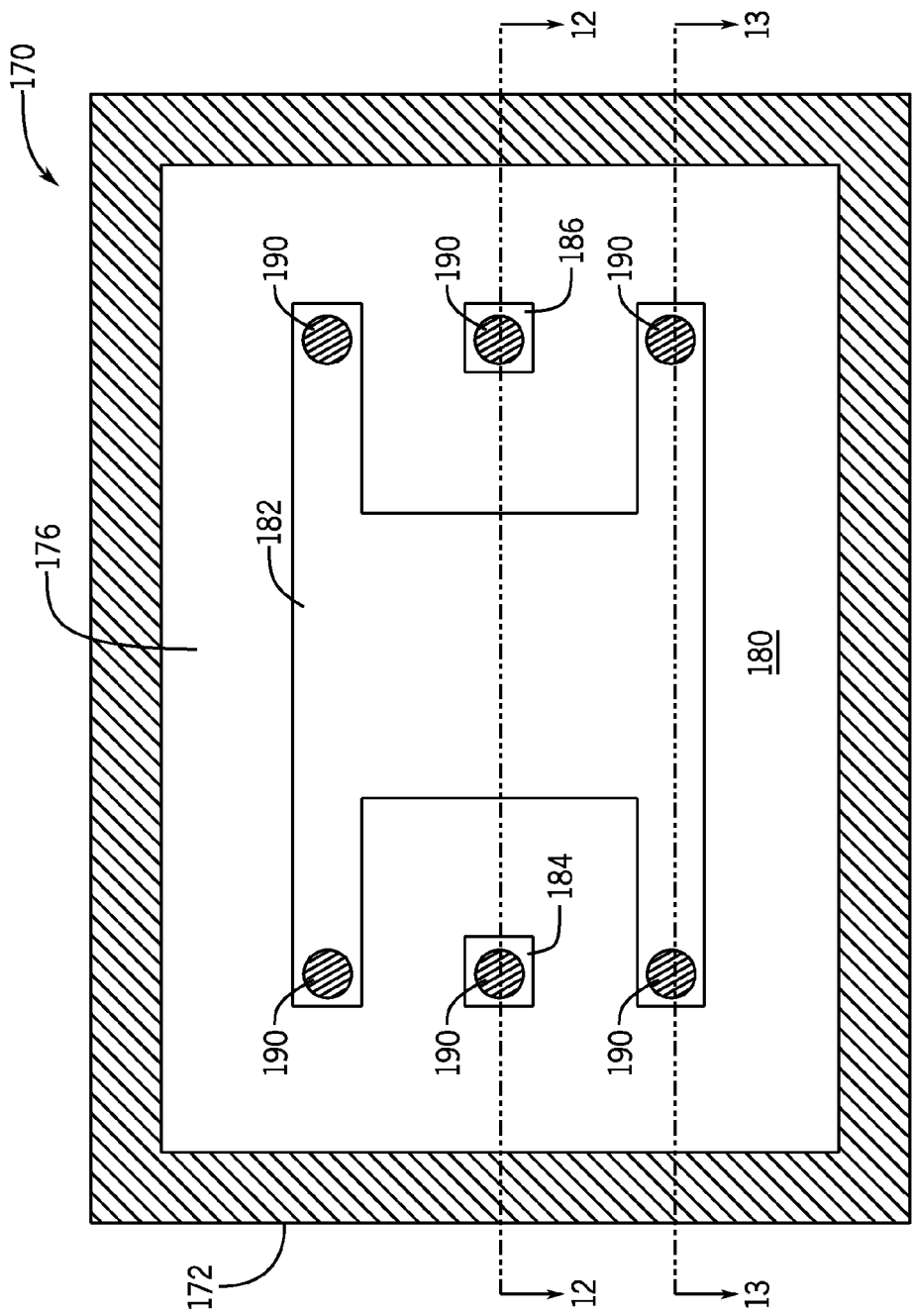
FIG. 11 is a schematic top view of a RF MEMS discrete package, according to another embodiment of the invention.
Figure 12:
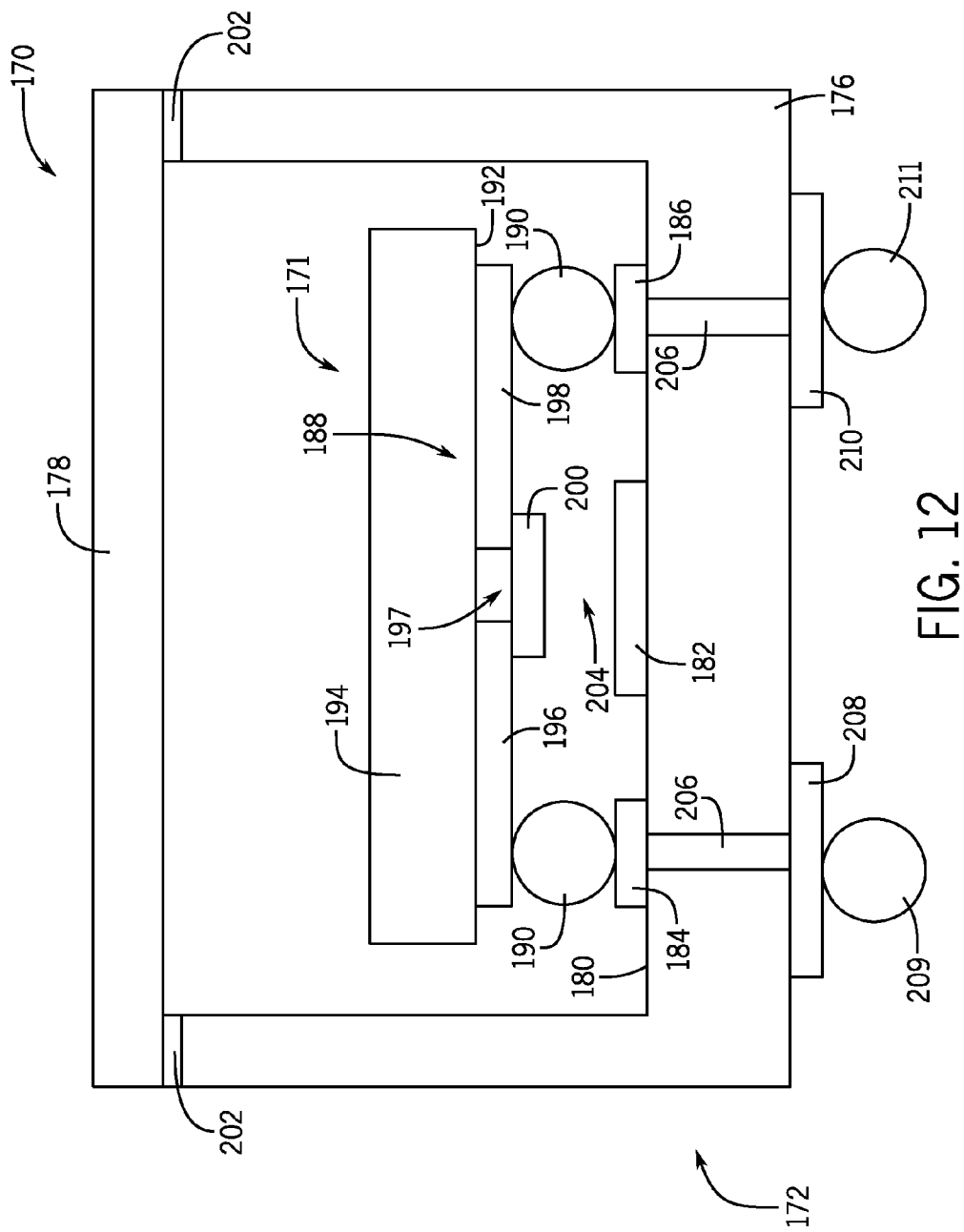
FIG. 12 is a side sectional view of the RF MEMS discrete package of FIG. 11 taken along line 12-12.
Figure 13:
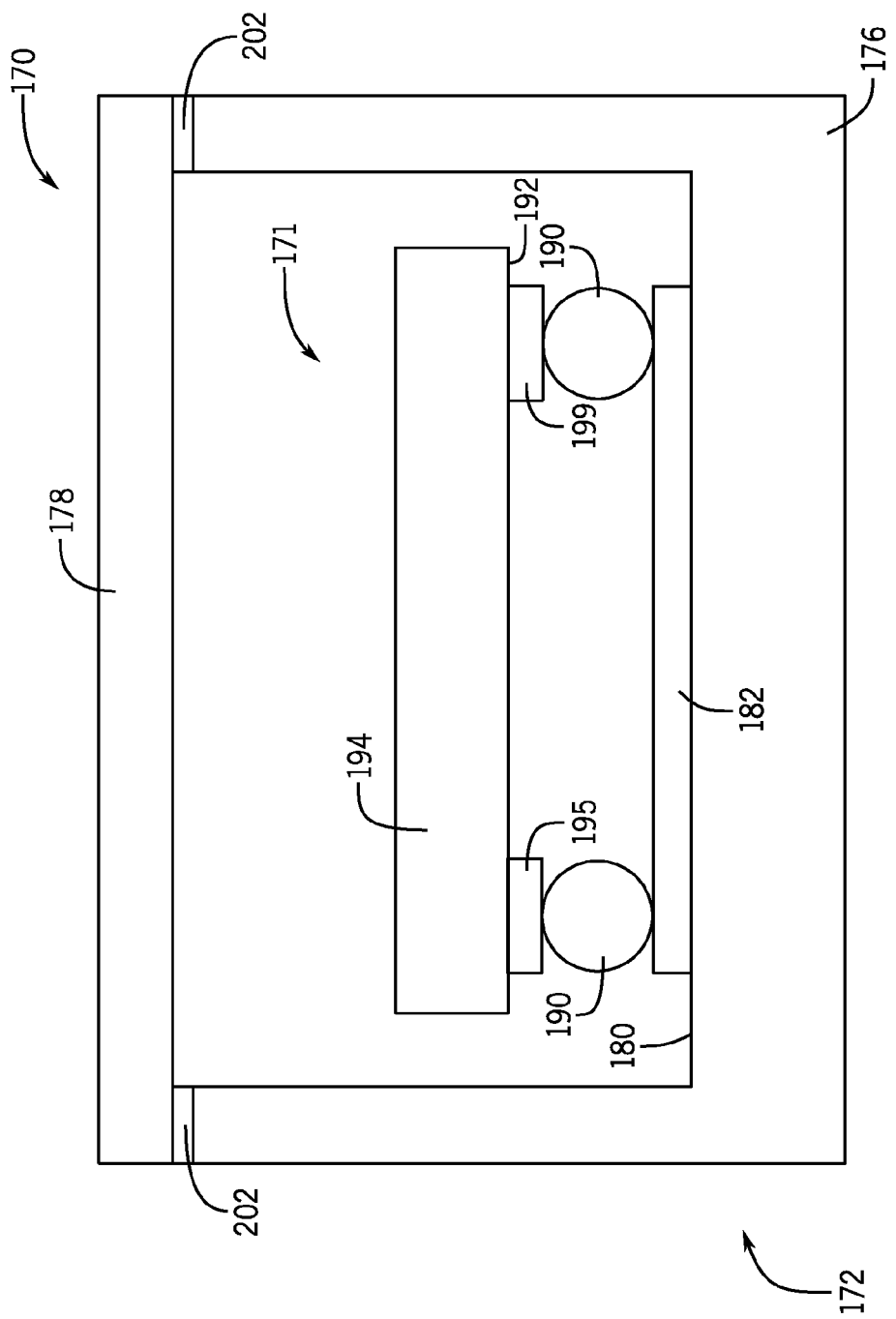
FIG. 13 is a side sectional view of the RF MEMS discrete package of FIG. 11 taken along line 13-13.

FIG. 11 illustrates a schematic top cross-sectional view of a RF MEMS discrete package 170 in accordance with an alternative embodiment of the invention, while FIGS. 12-13 depicts schematic side sectional views taken along lines 12-12 and 13-13, respectively. In this embodiment, RF MEMS package 170 includes a MEMS die assembly 171, similar in construction to MEMS die assembly 41 (FIG. 4), and a ground assembly 172 that includes a main body 176 and a lid 178 made from an insulating material such as, but not limited to, a ceramic. As shown in FIG. 11, a ground pad region 182 is formed on an interior bottom surface 180 of main body 176. Ground assembly 172 further includes signal pads 184, 186 formed on the top surface 180 of main body 176.

Signal pads 184, 186 are bonded and electrically coupled to an electrically conductive signal line 188 of MEMS die assembly 171 through electrical contacts or interconnects 190, which are formed from any material suitable for bonding and electrically coupling signal pads 184, 186 to signal line 188, for example, but not limited to solder stud bumps, gold stud bumps, and thermosonic attachment stud bumps. Similar to signal line 46 (FIG. 4), signal line 188 is formed on a surface 192 of a MEMS substrate 194 of the MEMS die assembly 171 and includes a first portion 196, a second portion 198, and a MEMS device 200 that bridges a gap 197 between first and second portions 196, 198.

In addition, a plurality of ground pads 195, 199 are formed on the downward-facing surface 192 of MEMS substrate 194. While only two ground pads 195, 199 are shown in the provided figures, it is contemplated that MEMS die assembly 171 includes at least one pair of ground pads positioned adjacent each portion 196, 198 of signal line 188, similar to ground pads 52-58 (FIG. 4). Interconnects 190 are used to bond and electrically couple ground region 182 to each of the plurality of grounds pads 195, 199.

According to an embodiment of the invention, a hermetic seal 202 is formed between the main body 176 and the lid 178 of ground assembly 172 using any hermetic sealing process known in the art, for example, but not limited to, hermetic solder sealing, glass frit sealing, and gold-gold thermo-compression sealing. As a result, a cavity 204 between signal line 188 and ground pad region 182 is air-tight and unable to fluidically communicate with the external environment. Consequently, cavity 204 may be filled with air or another dielectric gas, such as, but not limited to, nitrogen.

As shown in FIG. 12, a plurality of electrically conductive vias 206 are formed through the main body 176 of ground assembly 172. Each via 206 is aligned with a corresponding signal pad 184, 186, and electrically couples signal pads 184, 186 to signal pads 208, 210 disposed an outer surface 212 of discrete package 174. Signal pads 208, 210 are disposed on the outer surface 212 of discrete package 174 to facilitate an electrical connection between the RF MEMS package 170 and an external printed circuit board (not shown) by way of input/output (I/O) connections 209, 211.

In the embodiments described above, the ground assembly is electrically grounded by way of one or more electrical connections to ground pads on the MEMS die assembly. These electrical connections also mechanically couple the ground assembly to the MEMS die assembly. In an alternative embodiment shown in FIG. 14, a RF MEMS package 214 includes a MEMS die assembly 215 coupled to a ground plane assembly 217 with mechanical posts 234, which are constructed of a non-conductive material. The ground plane assembly 217 is grounded via a connection to an external ground (not shown), as described in more detail below.

Similar to MEMS die assembly 41 (FIG. 3), MEMS die assembly 215 includes an electrically conducting signal line 216 disposed on a top surface 218 of a MEMS mounting substrate 220. Signal line 216 includes a MEMS device 222, which, like MEMS device 48 (FIG. 3), may be an ohmic contact switch mechanism or a capacitive switch mechanism and may utilize any known actuation means. MEMS substrate 220 may be formed of an insulating, semi-insulating, or semi-conductive material such as, but not limited to, quartz, alumina, gallium arsenide, silicon, and the like. In this embodiment of the invention, no ground lines or ground pads are formed on the top surface 218 of MEMS substrate 220, as shown in FIG. 15.

Figure 14:
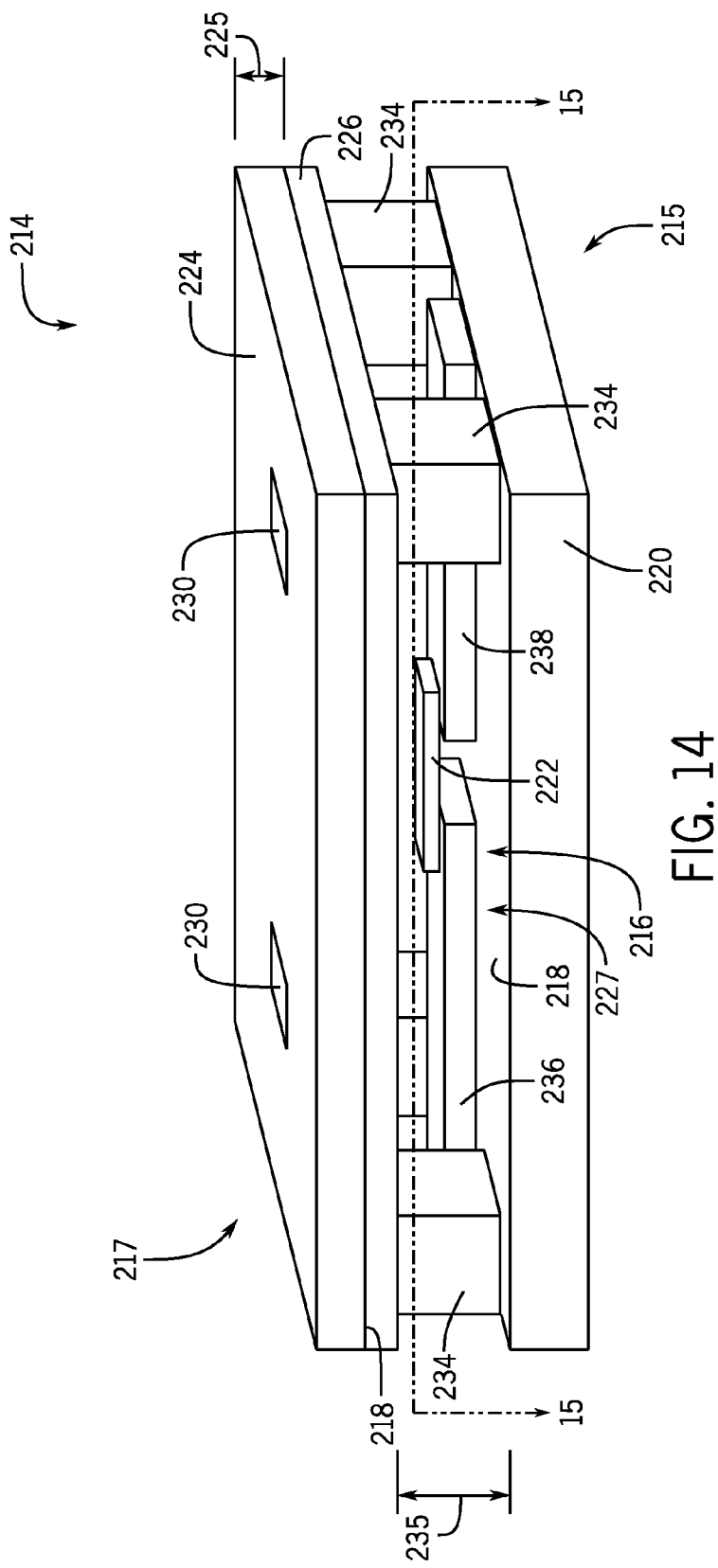
FIG. 14 is a schematic perspective view of a RF MEMS package, according to another embodiment of the invention.
Figure 15:
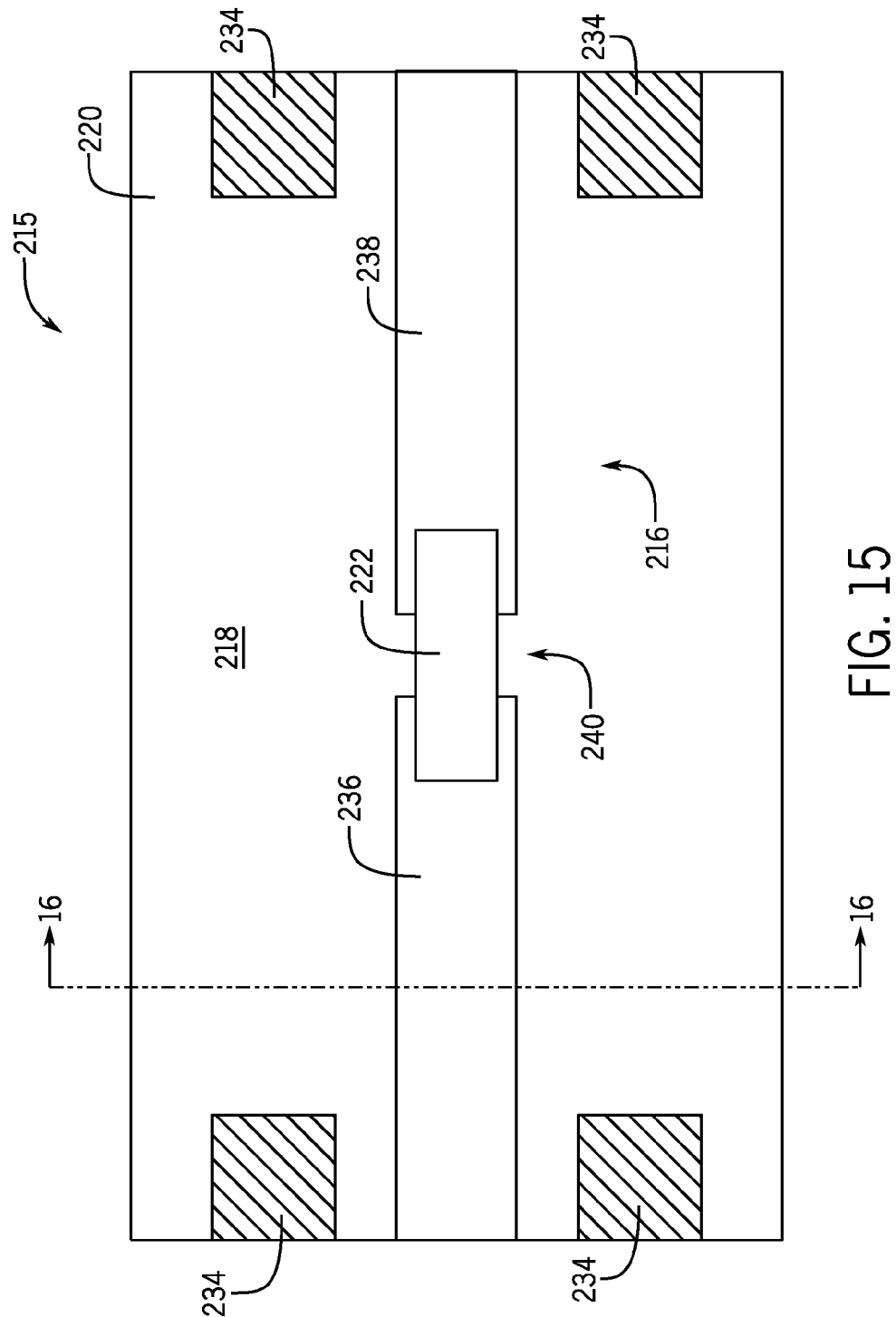
FIG. 15 is a schematic cross-sectional view of the RF MEMS package of FIG. 14 taken along line 15-15.
Figure 16:
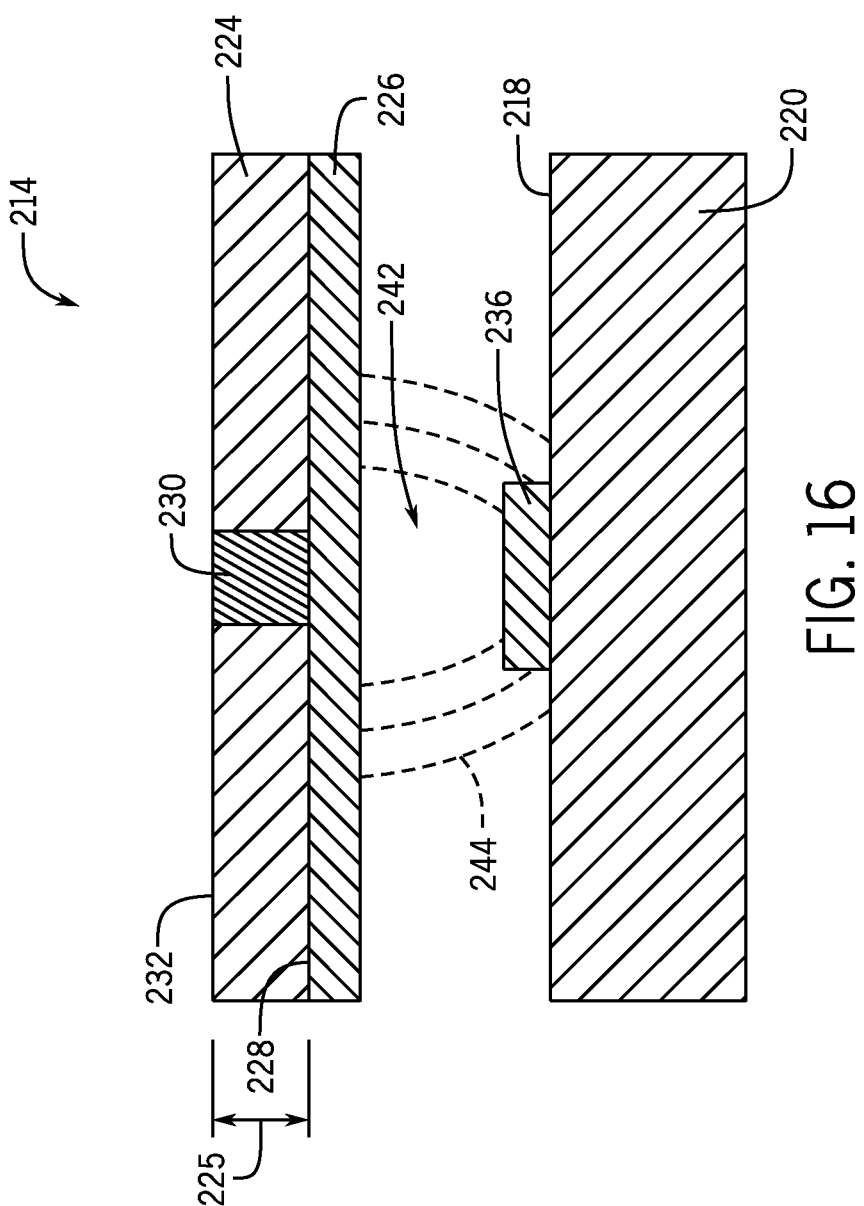
FIG. 16 is a schematic sectional view of the RF MEMS package of FIG. 15 taken along line 16-16.

Referring to FIGS. 14-16 together where appropriate, ground assembly 217 includes a ground mounting substrate 224 having a ground plane 226 formed on a bottom surface 228 thereof. Ground plane 226 is a conductive material such as, for example, copper, gold, a tungsten/nickel/gold stack, or another common packaging material. Ground substrate 224 may be formed of the same or different insulating, semi-insulating, or semi-conductive material as MEMS substrate 220. At least one via is formed through a thickness 225 of ground substrate 224 defined between a top surface 232 and the bottom surface 228 thereof. Each via is filled with a conductive material and to create a metal interconnect 230 for electrically coupling ground plane 226 to an external ground source (not shown).

As shown, mechanical posts 234 couple MEMS die assembly 215 to ground assembly 217, while spacing MEMS mounting substrate 220 and its associated signal line 216 apart from ground plane 226. The height 235 of mechanical posts 234 may be selected to define the spacing between signal line 216 and ground plane 226. A cavity 242 is created between signal line 216 and ground plane 226. In one embodiment of the invention, cavity 242 may be hermetically sealed between ground plane 226 and MEMS substrate 220 so that cavity 242 does not fluidically communicate with the external environment. Cavity 242 may be filled with a dielectric gas, such as, but not limited to, nitrogen in order to dampen resonant responses within the package 214. Similar to RF MEMS package 40 (FIG. 3), the lateral component 244 of the electromagnetic field extends only through cavity 242, not through MEMS mounting substrate 220.

Signal line 216 is constructed in the same manner as signal line 46 of RF MEMS die assembly 41 (FIG. 3). That is, signal line 216 has a first portion 236, a second portion 238 separated from the first portion 236 by a gap 240, and a MEMS device 222 to bridge gap 240. Together, the signal line 216 of MEMS die assembly 215 and ground plane 226 of ground assembly 217 form a RF transmission line 227. When in a closed position, MEMS device 222 electrically couples first portion 236 and second portion 238 to create a closed circuit on RF transmission line 227. When in an open position, MEMS device 222 electrically decouples first portion 236 and second portion 238 to create an open circuit on RF transmission line 227. The electrical impedance of RF transmission line 227 may be controlled by adjusting the height of mechanical posts 234 in order to control the distance between signal line 216 and ground plane 226.

Similar to RF MEMS package 40 (FIG. 3), RF MEMS package 214 results in a structure having a flipped or inverted orientation, with the ground plane 226 positioned above the signal line 216, rather than coupled directly to a bottom surface of the MEMS substrate 220 as with prior art devices. As such, RF signal propagation is allowed without forming vias through the mounting substrate 220 of MEMS die assembly 215. Such construction is especially advantageous where the mounting substrate is a material that is difficult to process, such as quartz or silicon, and also permits packages to be constructed with higher density signal lines. Further, as shown in FIG. 16, the electromagnetic field generated between the first portion 236 of signal line 216 and ground plane 226 includes a lateral component 246 that extends only through cavity 242, not through MEMS substrate 220. As such, signal losses within the RF MEMS package 214 are significantly improved as compared to prior art devices wherein the electromagnetic field permeates the dielectric substrate.

Figure 17:
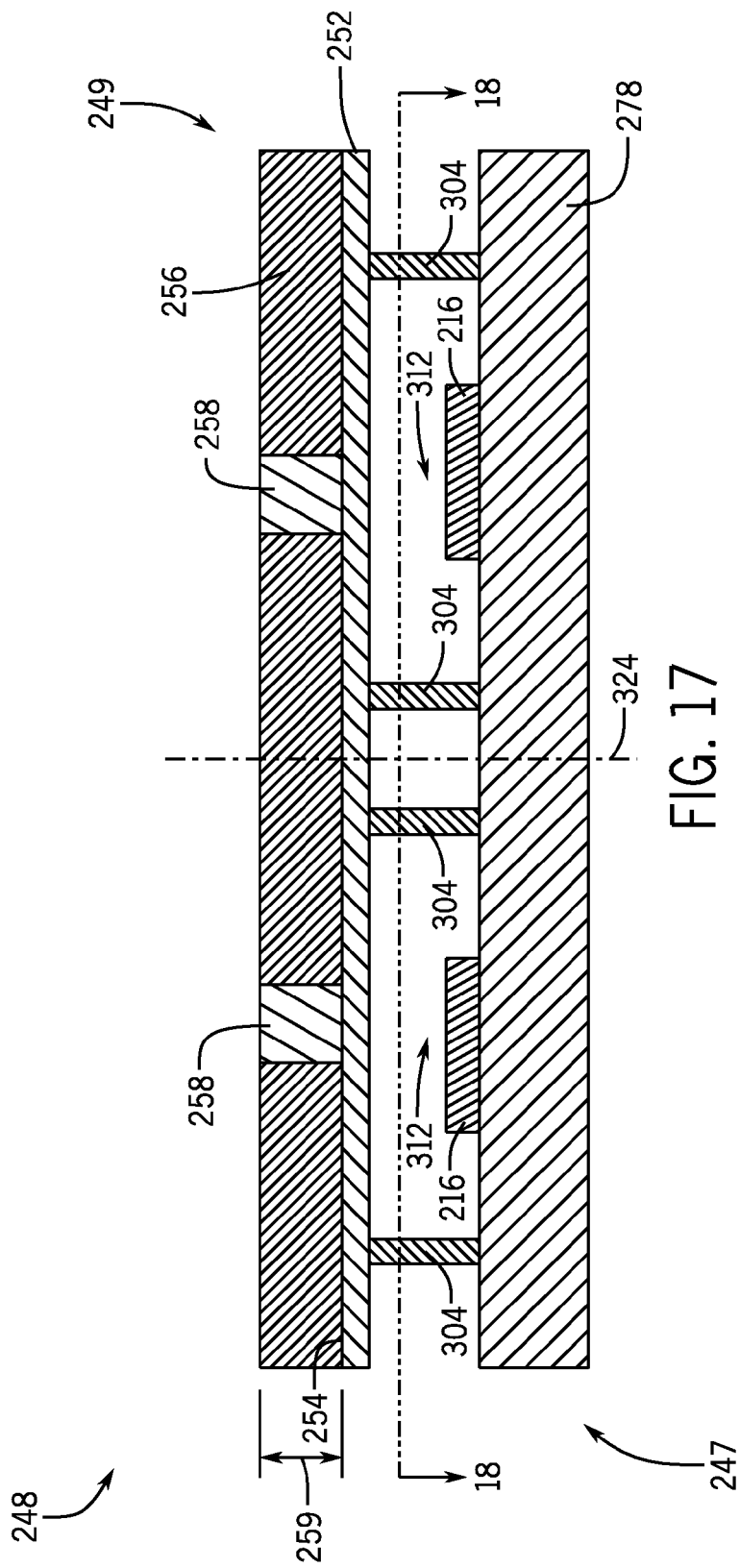
FIG. 17 is a schematic cross-sectional side view of a RF MEMS wafer structure, according to an embodiment of the invention.
Figure 18:
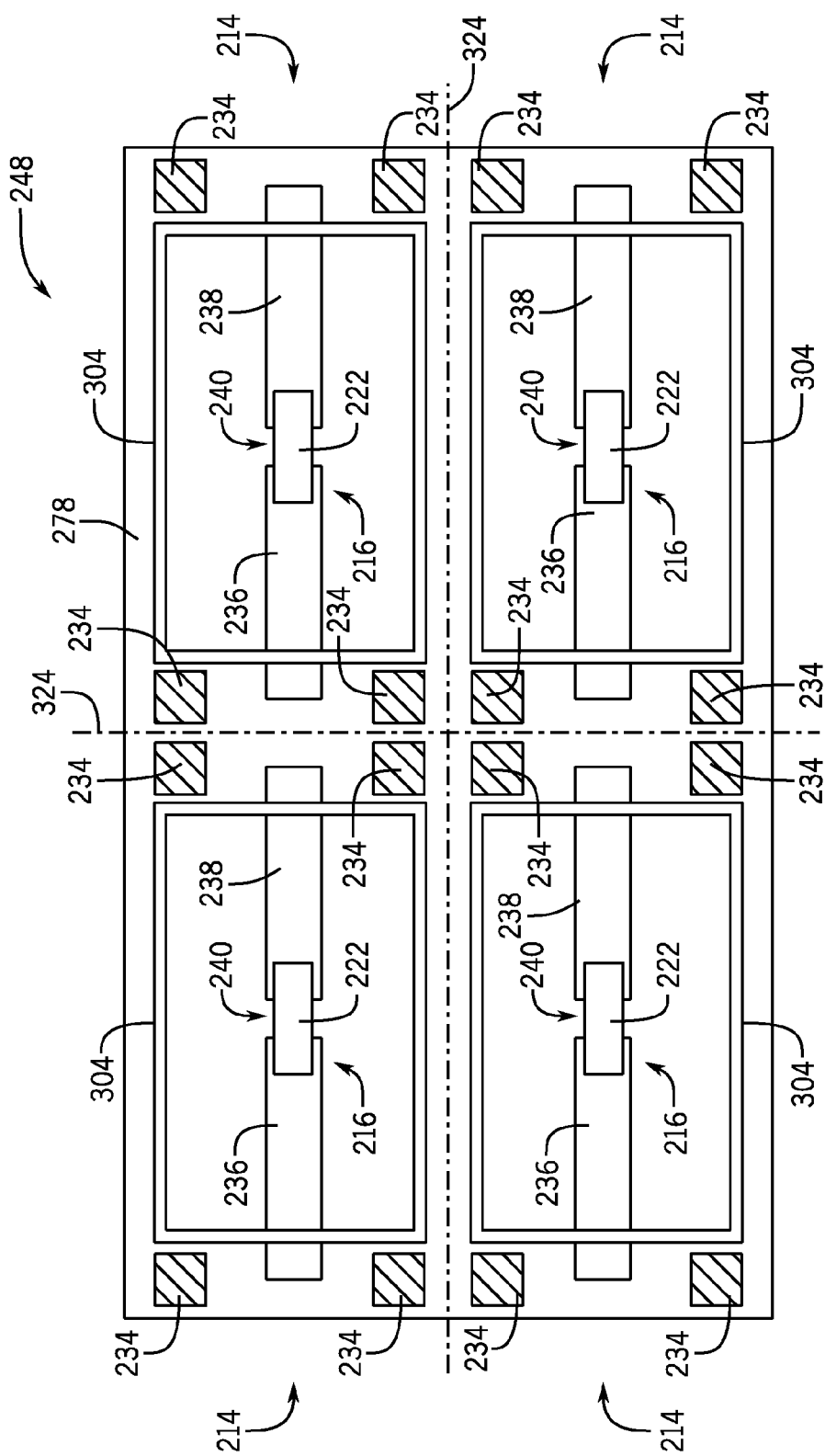
FIG. 18 is a schematic cross-sectional view of the RF MEMS wafer structure of FIG. 17 taken along line 18-18.

In another embodiment of the invention, multiple RF MEMS packages 214 may be singulated from a RF MEMS wafer structure 248, as illustrated in FIGS. 17 and 18. In such an embodiment, a MEMS wafer assembly 247 is formed with multiple MEMS devices 222 provided on respective signal lines 216 of a MEMS wafer substrate 278. RF MEMS wafer structure 248 is formed when MEMS wafer assembly 247 is coupled to ground plane assembly 249, which includes a ground plane 252 formed on a bottom surface 254 of a ground substrate 256. Similar to ground plane assembly 217 of FIG. 14, ground plane assembly 249 further includes a plurality of interconnects 258 that extend through a thickness 259 of ground substrate 256 and are electrically coupled to ground plane 252. Interconnects 258 are positioned within ground plane assembly 249 such that each resulting RF MEMS package 214 includes at least one interconnect 258 for coupling ground plane 252 to an external ground (not shown).

Similar to the embodiment of FIG. 10, hermetic seals 304 are formed between ground plane 252 and MEMS wafer substrate 278 creating cavities 312 between ground plane 252 and signal lines 216 that may be filled with air or another dielectric gas, such as, but not limited to, nitrogen. In the illustrated embodiment, seals 304 are a non-conductive material such as glass-fit, similar to hermetic seals 149, 151 (FIG. 10). As such, the signal lines 216 may be constructed to extend beyond the hermetic seals 304, thereby permitting external electrical connections to be made to signal lines 216. Once complete, multiple RF MEMS packages 214 may be singulated from RF MEMS wafer structure 248 along cut lines 324. While FIG. 18 illustrates the use of a single MEMS device 222 within each RF MEMS package 214, alternative embodiments of the invention may include multiple MEMS devices 222 within each package.

In an alternative embodiment of the invention, posts 234 may be in the form of a continuous material that surrounds signal line 216 and MEMS device 222 and creates a hermetically sealed cavity 312. As such, each RF MEMS package 214 would include a single mechanical post 234 that serves the dual functions of (1) creating a hermetically sealed cavity 312 and (2) coupling MEMS die assembly 215 to ground plane assembly 217.

Beneficially, embodiments of the invention thus provide a RF MEMS package and RF MEMS wafer that permits RF signal propagation using a MEMS die assembly that does not include a dedicated ground plane. When the MEMS package is bonded to another substrate having a flipped or inverted ground plane, the signal line of the MEMS die assembly and the ground plane of the second substrate form a RF transmission line. Because the lateral components of the electromagnetic field generated between the flipped or inverted ground plane and MEMS device resides primarily in the air or dielectric-filled cavity between the ground plane and the MEMS device, signal losses are reduced as compared to prior art devices that include through substrate vias and dedicated ground planes. Further, embodiments of the invention disclosed herein permit the fabrication of MEMS packages with increased signal density, as a result in part of the omission of through vias, and greater flexibility in substrate material selection.

According to one embodiment of the invention, a radio frequency (RF) microelectromechanical system (MEMS) package includes a MEMS die assembly having a first mounting substrate, a signal line formed on a top surface of the first mounting substrate, the signal line comprising a MEMS device selectively electrically coupling a first portion of the signal line to a second portion of the signal line, a first pair of ground pads formed on the top surface of the first mounting substrate adjacent the first portion of the signal line, and a second pair of ground pads formed on the top surface of the first mounting substrate adjacent the second portion of the signal line. The RF MEMS package also includes a ground assembly electrically coupled to the first pair of ground pads and the second pair of ground pads, the ground assembly having a second mounting substrate, and a ground region formed on a surface of the second mounting substrate facing the top surface of the first mounting substrate and electrically coupled to the first pair of ground pads and the second pair of ground pads. A cavity is formed between the ground region and the signal line, and the first pair of ground pads is positioned adjacent a first side of the MEMS device and the second pair of ground pads is positioned adjacent a second side of the MEMS device.

According to another embodiment of the invention, a method of manufacturing a radio frequency (RF) microelectromechanical system (MEMS) package includes providing a first mounting substrate, and forming a signal line on a top surface of the first mounting substrate, wherein forming the signal line includes forming a first portion of the signal line on the top surface of the first mounting substrate, forming a second portion of the signal line on the top surface of the first mounting substrate so as to provide a gap between the first portion and the second portion, and coupling a MEMS device to the first portion of the signal line and the second portion of the signal line to bridge the gap. The method further includes forming a first pair of ground pads on the top surface of the first mounting substrate adjacent the first portion of the signal line, forming a second pair of ground pads on the top surface of the first mounting substrate adjacent the second portion of the signal line, the second pair of ground pads spaced apart from the first pair of ground pads, coupling a ground assembly to the first pair of ground pads and the second pair of ground pads, the ground assembly comprising a ground region formed on a bottom surface of a second mounting substrate, and spacing the ground region apart from the signal line so as to provide a cavity therebetween.

According to yet another embodiment of the invention, a radio frequency (RF) microelectromechanical system (MEMS) wafer structure includes a MEMS wafer assembly having a plurality of MEMS devices disposed on a top surface of a wafer substrate, a plurality of signal lines formed on the top surface of the wafer substrate, each signal line having a first portion positioned on a first side of a respective MEMS device and a second portion positioned on a second side of the respective MEMS device, the second portion separated from the first portion by a first gap, a first pair of ground pads adjacent to and on either side of the first portion of a respective signal line, and a second pair of ground pads adjacent to and on either side of the second portion of the respective signal line. The RF MEMS wafer structure further includes a ground plane assembly comprising a ground plane formed on a bottom surface of a ground substrate, the ground plane bonded to the first pair of ground pads and second pair of ground pads, wherein the ground plane and the plurality of signal pads are spaced apart by a plurality of cavities, each cavity containing a respective MEMS device, and the top surface of the MEMS substrate adjacent the plurality of MEMS devices is free of ground pads.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A radio frequency (RF) microelectromechanical system (MEMS) package comprising:
    a MEMS die assembly comprising:
        a first mounting substrate;
        a signal line formed on a top surface of the first mounting substrate, the signal line comprising a MEMS device selectively electrically coupling a first portion of the signal line to a second portion of the signal line;
        a first pair of ground pads formed on the top surface of the first mounting substrate adjacent the first portion of the signal line; and
        a second pair of ground pads formed on the top surface of the first mounting substrate adjacent the second portion of the signal line; and
    a ground assembly electrically coupled to the first pair of ground pads and the second pair of ground pads, the ground assembly comprising:
        a second mounting substrate; and
        a ground region formed on a surface of the second mounting substrate facing the top surface of the first mounting substrate and electrically coupled to the first pair of ground pads and the second pair of ground pads;
    wherein a cavity is formed between the ground region and the signal line; and
    wherein the first pair of ground pads is positioned adjacent a first side of the MEMS device and the second pair of ground pads is positioned adjacent a second side of the MEMS device.

2. The RF MEMS package of claim 1 wherein the MEMS device comprises a switch having an open position and a closed position;
    wherein the first portion of the signal line and the second portion of the signal line are electrically coupled when the switch is in the closed position; and
    wherein the first portion of the signal line and the second portion of the signal line are electrically decoupled when the switch is in the open position.

3. The RF MEMS package of claim 1 further comprising a plurality of interconnects electrically and mechanically coupling the ground region to the first pair of ground pads and to the second pair of ground pads.

4. The RF MEMS package of claim 3 wherein the plurality of interconnects comprise at least one of solder bumps, gold bumps, and thermosonic bumps.

5. The RF MEMS package of claim 1 wherein a hermetic seal is formed between the ground region and the first mounting substrate.

6. The RF MEMS package of claim 5 wherein the hermetic seal is one of a glass frit seal, a gold-gold thermocompression seal, and a hermetic solder seal.

7. The RF MEMS package of claim 5 further comprising a dielectric gas provided within the cavity.

8. The RF MEMS package of claim 1 wherein each ground pad of the first pair of ground pads has a length less than a length of the first portion of the signal line; and
wherein each ground pad of the second pair of ground pads has a length less than a length of the second portion of the signal line.

9. The RF MEMS package of claim 1 wherein the ground assembly comprises a main body and a lid coupled to the main body; and
wherein the MEMS die assembly is positioned within a cavity formed between the main body and the lid.

10. The RF MEMS package of claim 9 further comprising at least one electrically conductive via extending through the main body of the ground assembly and electrically coupling the ground region to an external input/output connection of the main body.

11. A method of manufacturing a radio frequency (RF) microelectromechanical system (MEMS) package comprising:
providing a first mounting substrate;
forming a signal line on a top surface of the first mounting substrate, wherein forming the signal line comprises:
forming a first portion of the signal line on the top surface of the first mounting substrate;
forming a second portion of the signal line on the top surface of the first mounting substrate so as to provide a gap between the first portion and the second portion; and
coupling a MEMS device to the first portion of the signal line and the second portion of the signal line to bridge the gap;
forming a first pair of ground pads on the top surface of the first mounting substrate adjacent the first portion of the signal line;
forming a second pair of ground pads on the top surface of the first mounting substrate adjacent the second portion of the signal line, the second pair of ground pads spaced apart from the first pair of ground pads;
coupling a ground assembly to the first pair of ground pads and the second pair of ground pads, the ground assembly comprising a ground region formed on a bottom surface of a second mounting substrate; and
spacing the ground region apart from the signal line so as to provide a cavity therebetween.

12. The method of claim 11 wherein coupling the ground assembly to the first pair of ground pads and the second pair of ground pads comprises at least one of soldering, brazing, and thermosonic bonding by way of a plurality of stud bumps.

13. The method of claim 11 further comprising forming a hermetic seal between the first mounting substrate and the ground plane.

14. The method of claim 13 further comprising filling the cavity with a dielectric gas.

15. The method of claim 11 further comprising spacing the first pair of ground pads apart from the second pair of ground pads across a width of the mounting substrate.

16. A radio frequency (RF) microelectromechanical system (MEMS) wafer structure comprising:
a MEMS wafer assembly comprising:
a plurality of MEMS devices disposed on a top surface of a wafer substrate;
a plurality of signal lines formed on the top surface of the wafer substrate, each signal line comprising:
a first portion positioned on a first side of a respective MEMS device; and
a second portion positioned on a second side of the respective MEMS device, the second portion separated from the first portion by a first gap;
a first pair of ground pads adjacent to and on either side of the first portion of a respective signal line; and
a second pair of ground pads adjacent to and on either side of the second portion of the respective signal line; and
a ground plane assembly comprising a ground plane formed on a bottom surface of a ground substrate, the ground plane bonded to the first pair of ground pads and second pair of ground pads;
wherein the ground plane and the plurality of signal pads are spaced apart by a plurality of cavities, each cavity containing a respective MEMS device; and
wherein the top surface of the MEMS substrate adjacent the plurality of MEMS devices is free of ground pads.

17. The RF MEMS wafer structure of claim 16 wherein the first pair of ground pads is electrically disconnected from the second pair of ground pads across a width of the wafer substrate.

18. The RF MEMS wafer structure of claim 16 wherein the wafer substrate comprises one of silicon and quartz.

19. The RF MEMS wafer structure of claim 16 wherein each MEMS device has an open position configured to decouple the first portion and the second portion of a respective signal line, and a closed position configured to couple the first portion and the second portion of the respective signal line.

20. The RF MEMS wafer structure of claim 16 wherein the plurality of cavities are hermetically sealed.

21. The RF MEMS wafer structure of claim 16 further comprising a plurality of cut lines formed on at least one of the MEMS wafer and the ground wafer, the plurality of cut lines defining boundaries of individual RF MEMS packages within the RF MEMS wafer structure, each individual RF MEMS package comprising at least one MEMS device.

22. The RF MEMS wafer structure of claim 16 wherein the ground plane and each of the plurality of signal lines forms a RF transmission line.

* * * * *